(12) United States Patent
Tachibana et al.

(10) Patent No.: US 11,042,090 B2
(45) Date of Patent: Jun. 22, 2021

(54) COMPOSITION FOR FORMING ORGANIC FILM

(71) Applicant: SHIN-ETSU CHEMICAL CO., LTD., Tokyo (JP)

(72) Inventors: Seiichiro Tachibana, Jyoetsu (JP); Hiroko Nagai, Jyoetsu (JP); Daisuke Kori, Jyoetsu (JP); Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/044,015

(22) Filed: Jul. 24, 2018

(65) Prior Publication Data

US 2019/0041752 A1    Feb. 7, 2019

Related U.S. Application Data

(63) Continuation-in-part of application No. 15/669,338, filed on Aug. 4, 2017, now abandoned.

(51) Int. Cl.
*G03F 7/11*     (2006.01)
*G03F 7/09*     (2006.01)
(Continued)

(52) U.S. Cl.
CPC .............. *G03F 7/11* (2013.01); *C08G 8/04* (2013.01); *C08G 8/20* (2013.01); *C08G 8/22* (2013.01);
(Continued)

(58) Field of Classification Search
None
See application file for complete search history.

(56) References Cited

U.S. PATENT DOCUMENTS 7,427,464 B2   9/2008  Hatakeyama
2008/0038662 A1 2/2008  Hatakeyama et al.
(Continued)

FOREIGN PATENT DOCUMENTS

CN    101622580 A    1/2010
CN    103619892 A    3/2014
(Continued)

OTHER PUBLICATIONS

Mar. 8, 2019 Korean Office Action issued in Korean Application No. 10-2017-0155725.

*Primary Examiner* — Robert T Butcher
(74) *Attorney, Agent, or Firm* — Oliff PLC

(57) ABSTRACT

The present invention provides a composition for forming an organic film, containing a polymer compound having one or more of repeating units shown by the general formulae (1) to (4) and an organic solvent containing one or more compounds selected from propylene glycol esters, ketones, and lactones, with a total concentration of more than 30 wt % with respect to the whole organic solvent. There can be provided a composition capable of forming an organic film that can be easily removed, together with a silicon residue modified by dry etching, in a wet manner with a removing liquid harmless to a semiconductor apparatus substrate and an organic resist underlayer film required in the patterning process, for example, an ammonia aqueous solution containing hydrogen peroxide called SC1, which is commonly used in the semiconductor manufacturing process.

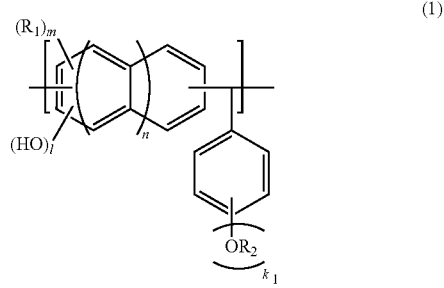

(1)

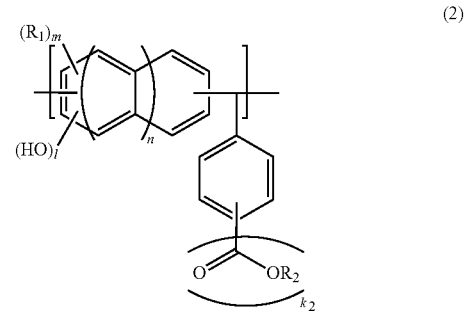

(2)

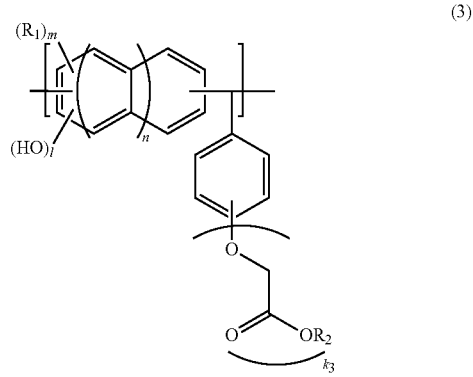

(3)

(Continued)

-continued

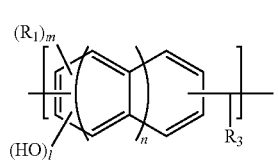

(4)

7 Claims, No Drawings

(51) Int. Cl.
- *G03F 7/16* (2006.01)
- *C08G 16/02* (2006.01)
- *C09D 161/00* (2006.01)
- *C08G 8/22* (2006.01)
- *C08G 8/20* (2006.01)
- *C08G 8/04* (2006.01)
- *C09D 161/12* (2006.01)
- *G03F 7/075* (2006.01)

(52) U.S. Cl.
CPC ....... *C08G 16/0237* (2013.01); *C09D 161/00* (2013.01); *C09D 161/12* (2013.01); *G03F 7/0752* (2013.01); *G03F 7/094* (2013.01); *G03F 7/162* (2013.01); *G03F 7/168* (2013.01)

(56) References Cited

U.S. PATENT DOCUMENTS

| | | |
|---|---|---|
| 2009/0274978 A1 | 11/2009 | Ohashi et al. |
| 2010/0081081 A1 | 4/2010 | Enomoto et al. |
| 2010/0086870 A1 | 4/2010 | Ogihara et al. |
| 2010/0086872 A1 | 4/2010 | Ogihara et al. |
| 2010/0099044 A1 | 4/2010 | Hatakeyama et al. |
| 2011/0233489 A1 | 9/2011 | Fu et al. |
| 2012/0252218 A1 | 10/2012 | Kori et al. |
| 2013/0171569 A1* | 7/2013 | Tachibana ............... G03F 7/004 430/287.1 |
| 2013/0184404 A1 | 7/2013 | Hatakeyama et al. |
| 2013/0337649 A1 | 12/2013 | Tachibana et al. |
| 2014/0186776 A1 | 7/2014 | Uchiyama et al. |
| 2015/0004791 A1 | 1/2015 | Ogihara et al. |
| 2016/0056047 A1 | 2/2016 | Kori |
| 2016/0096977 A1 | 4/2016 | Tachibana et al. |
| 2016/0096978 A1 | 4/2016 | Tachibana et al. |
| 2016/0159962 A1 | 6/2016 | Imada et al. |
| 2016/0276152 A1 | 9/2016 | Tachibana et al. |
| 2017/0003592 A1 | 1/2017 | Ishikawa et al. |
| 2017/0003595 A1 | 1/2017 | Aoki et al. |

FOREIGN PATENT DOCUMENTS

| | | |
|---|---|---|
| JP | 2004-205685 A | 7/2004 |
| JP | 2008-065303 A | 3/2008 |
| JP | 2009-269953 A | 11/2009 |
| JP | 2010-085893 A | 4/2010 |
| JP | 2010-085912 A | 4/2010 |
| JP | 2010-122656 A | 6/2010 |
| JP | 2012-214720 A | 11/2012 |
| JP | 2013-156627 A | 8/2013 |
| JP | 2015-028145 A | 2/2015 |
| JP | 2016-044241 A | 4/2016 |
| JP | 2016-074772 A | 5/2016 |
| JP | 2016-074774 A | 5/2016 |
| JP | 2016-094612 A | 5/2016 |
| JP | 2016-177262 A | 10/2016 |
| KR | 10-2016-0033652 A | 3/2016 |
| KR | 10-2016-0112945 A | 9/2016 |
| WO | 2010/068336 A1 | 6/2010 |
| WO | 2015/146523 A1 | 10/2015 |
| WO | 2015/146524 A1 | 10/2015 |

OTHER PUBLICATIONS

Aug. 21, 2018 Office Action issued in Taiwanese Patent Application No. 106136454.
Mar. 23, 2021 Office Action issued in Japanese Patent Application No. 2018-129694.

* cited by examiner

COMPOSITION FOR FORMING ORGANIC FILM

BACKGROUND OF THE INVENTION

Field of the Invention

The present invention relates to a multilayer resist film composition used for forming a wiring pattern on a semiconductor apparatus manufacturing substrate, and more particularly to a composition for forming an organic film.

Description of the Related Art

Conventionally, processing performance of a semiconductor apparatus has been mainly improved by shortening the wavelength of a light source in lithography technology and thereby miniaturizing a pattern dimension. In recent years, however, an approach for shortening the wavelength of an ArF light source and later one delays, and alternative methods of improving processing performance of a semiconductor apparatus are required instead of the miniaturization. One proposed method is to densely arrange three-dimensional transistors, which can operate at higher speed than planar transistors, to obtain a semiconductor apparatus with high processing performance. A substrate used for manufacturing such a semiconductor apparatus (hereinafter, simply referred to as a substrate) has a three-dimensional structure obtained by more complicated stepped processing than a conventional substrate. Therefore, when a pattern is formed on this substrate by a monolayer photoresist patterning process, which is employed for forming conventional planar transistors, a photoresist film follows a step formed during processing the substrate, and the surface of the photoresist film is made uneven, failing to obtain a planar resist film. Thus, when the pattern is formed by exposing the photoresist to light, one cannot accurately focus on the photoresist, which causes a reduction of substrate processing yield. To prevent this problem, new materials and methods are required.

One solution for the problem is a multilayer resist method. This method can planarize a stepped substrate by an underlayer film having high planarizing property and form a photoresist film on the planarized film, thereby increasing focus margin at exposure and preventing the reduction of substrate processing yield. Furthermore, this method allows one, when a selected underlayer film has different etching selectivity from those of the upper layer photoresist film and the substrate, to form a pattern in the resist upper layer film, transfer the pattern to the middle layer film by dry etching using the resist upper layer film pattern as a dry etching mask, and further transfer the pattern to the substrate to be processed by dry etching using the underlayer film as a dry etching mask.

A common multilayer resist method is a three-layer resist method, which can utilize a usual resist composition used in the monolayer resist method. For example, an organic resist underlayer film having high planarizing property and sufficient dry etching resistance for substrate processing is formed on a substrate to be processed, a silicon-containing resist underlayer film is formed thereon as a middle layer film (hereinafter, referred to as a silicon-containing resist middle layer film), and a photoresist film is formed thereon as a resist upper layer film. In dry etching with fluorine-based gas plasma, since the organic resist upper layer film has good etching selectivity ratio relative to the silicon-containing resist middle layer film, a resist pattern can be transferred to the silicon-containing resist middle layer film by dry etching with fluorine-based gas plasma. In dry etching with oxygen-based gas plasma, since the silicon-containing resist middle layer film has good etching selectivity ratio relative to the organic resist underlayer film, a silicon-containing resist middle layer film pattern can be transferred to the organic resist underlayer film by dry etching with oxygen-based gas plasma. This method allows an organic resist underlayer film pattern having sufficient dry etching resistance for processing to be obtained by transferring the pattern only to the silicon-containing film even in the case of using a composition for forming a resist upper layer film that is difficult to form a pattern with a sufficient thickness for directly processing the substrate or using a composition for forming a resist upper layer film having insufficient dry etching resistance for processing the substrate. The pattern transfer by such dry etching does not cause problems such as pattern collapse due to friction of a developer during resist development, and thus an organic film pattern with a sufficient thickness to function as a dry etching mask can be obtained even if the aspect ratio is high. When the organic resist underlayer film pattern thus formed is used as the dry etching mask, the pattern can be transferred to a substrate having a three-dimensional transistor structure with complicated steps. As the aforementioned organic resist underlayer film, many materials are already known, for example, as described in Patent Document 1.

Generally, the three-layer resist method requires leaving the silicon-containing resist middle layer film several nm thick on the organic resist underlayer film pattern to stabilize the processing dimension when the pattern is transferred to the organic resist underlayer film by dry etching. The remaining silicon material is removed by etching with dry etching gas for processing the substrate when the pattern is transferred to the substrate by using the organic resist underlayer film pattern as a mask. Thus, no silicon material remains on the organic resist underlayer film pattern after substrate processing. Therefore, even when the organic resist underlayer film pattern remaining after substrate processing is dry etched (asking) or removed in a wet manner, no silicon material remains as a residue on the substrate.

As mentioned above, the multilayer resist method can also be applied to a substrate on which a large step is formed according to a substrate processing method, and thus is widely used for substrate processing. For this advantage, it is expected to use this method for an ion-implantation blocking mask in an ion-implantation step, which is a part of a three-dimensional transistor forming process. However, an organic resist underlayer film pattern for ion implantation formed by the three-layer resist method has a silicon material remaining thereon since the organic resist underlayer film pattern is not used as a mask for processing the substrate. Thus, when ions are implanted by using this organic resist underlayer film pattern as the blocking mask, the silicon material remaining on the organic resist underlayer film is modified by implanted ions, and cannot be removed together with the organic resist underlayer film pattern in a cleaning step after the implantation step. The material that cannot be removed remains on the substrate as foreign substances, reducing the yield in the ion implantation step. To prevent this problem, the silicon material remaining on the organic resist underlayer film pattern must be selectively cleaned and removed without affecting the organic resist underlayer film pattern prior to the ion implantation. However, since the silicon material is modified by dry etching gas for transferring the pattern to the organic resist underlayer film, the material cannot be cleaned and removed with an ammonia aqueous solution containing hydrogen peroxide (hereinafter, referred to as ammonia hydrogen peroxide water), which is commonly used as a harmless cleaning liquid to a substrate in the semiconductor manufacturing process. To completely clean and remove the modified silicon material, a hydrofluoric acid-based cleaning liquid is necessary. However, this cleaning liquid causes damage to the surface of a semiconductor substrate, reducing the yield in the processing process. Therefore, a method that can remove the silicon material remaining on the organic resist underlayer film pattern without causing damage to the substrate after transferring the pattern to the organic resist underlayer film by dry etching, and a material that is suitable for the method are desired.

PRIOR ART DOCUMENTS

Patent Documents

Patent Document 1: Japanese Unexamined Patent Application Publication No. 2016-094612 (US 2013/0337649 A1)

SUMMARY OF THE INVENTION

The present invention has been done to solve the above problems, and an object thereof is to provide a composition for forming an organic film capable of forming an organic film that can be easily removed, together with a silicon residue modified by dry etching, in a wet manner with a removing liquid harmless to a semiconductor apparatus substrate and an organic resist underlayer film required in the patterning process, for example, an ammonia aqueous solution containing hydrogen peroxide called SC1 (Standard Cleaner 1), which is commonly used in the semiconductor manufacturing process.

To accomplish the above objects, the present invention provides a composition for forming an organic film, comprising:

a polymer compound having one or more of repeating units shown by the following general formulae (1) to (4); and an organic solvent containing one or more compounds selected from propylene glycol esters, ketones, and lactones, the compounds having a total concentration of more than 30 wt % with respect to the whole organic solvent,

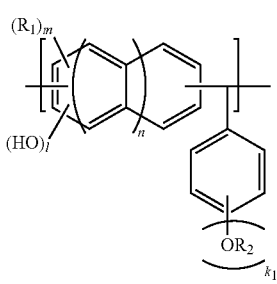

(1)

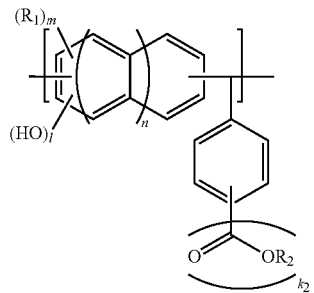

(2)

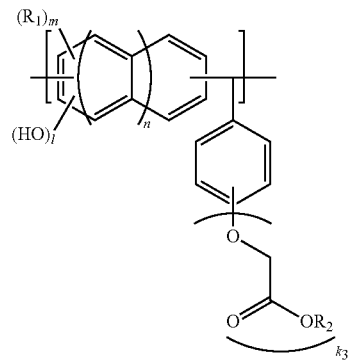

(3)

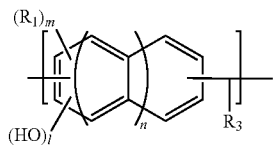

(4)

wherein $R_1$ represents a hydrocarbon group having 1 to 19 carbon atoms, a halogen atom, an alkoxy group, a carboxyl group, a sulfo group, a methoxycarbonyl group, a hydroxyphenyl group, or an amino group; $R_2$ represents a hydrogen atom or AL which is a group capable of generating an acidic functional group by heat or acid; $R_3$ represents a hydrogen atom, a furanyl group, or a hydrocarbon group having 1 to 16 carbon atoms and optionally containing a chlorine atom or a nitro group; $k_1$, $k_2$, and $k_3$ represent 1 or 2; "l" represents 1 to 3; "m" represents 0 to 3; and "n" represents 0 or 1.

This composition for forming an organic film is capable of forming an organic film that can be easily removed, together with a silicon residue modified by dry etching, in a wet manner with a removing liquid harmless to a semiconductor apparatus substrate and an organic resist underlayer film required in the patterning process, for example, an ammonia aqueous solution containing hydrogen peroxide called SC1, which is commonly used in the semiconductor manufacturing process. Moreover, this composition for forming an organic film is suitable as a material for an ion implantation blocking mask used for forming three-dimensional transistors.

The composition is preferably used for forming an organic film provided directly under a silicon-containing resist middle layer film soluble in ammonia hydrogen peroxide water and on an organic resist underlayer film difficultly soluble in ammonia hydrogen peroxide water.

In the three-layer resist method on a substrate, the inventive composition for forming an organic film (hereinafter, also referred to as present composition) can form an organic film (hereinafter, also referred to as present organic film) provided between an organic resist underlayer film and a silicon-containing resist middle layer film formed directly under a photoresist film. In other words, this composition for forming an organic film substantially enables a four-layer resist method. This method allows one to form an organic resist underlayer film on a substrate, form the present organic film between the organic resist underlayer film and a silicon-containing resist middle layer film, form the silicon-containing resist middle layer film, form a upper layer resist, form a pattern with the upper layer resist, transfer the pattern to the silicon-containing resist middle layer film by dry etching, and transfer the pattern to the present organic film and the organic resist underlayer film at once by dry etching using the transferred pattern as a mask. At this time, if the silicon-containing resist middle layer film is soluble in ammonia hydrogen peroxide water and the organic resist underlayer film is difficultly soluble in ammonia hydrogen peroxide water, the silicon material remaining on the transferred pattern can be removed by ammonia hydrogen peroxide water together with the present organic film. This enables the organic resist underlayer film pattern without a silicon residue to be obtained. By using this organic resist underlayer film pattern as the ion implantation blocking mask, ions can be accurately implanted in three-dimensional transistors having large steps. Thus, the three-dimensional transistors can be processed in high yield.

Additionally, the silicon-containing resist middle layer film preferably contains either or both of boron and phosphorus.

When the pattern is transferred to the present organic film and the organic resist underlayer film at once by dry etching using the silicon-containing resist middle layer film having the formed pattern as a mask, the solubility of the silicon-containing resist middle layer film pattern with respect to ammonia hydrogen peroxide water can be reduced due to the structural change by gas or plasma in dry etching. However, when the silicon-containing resist middle layer film contains either or both of boron and phosphorus, the silicon-containing resist middle layer film and/or the silicon residue can be made soluble in ammonia hydrogen peroxide water even after dry etching, regardless of gas and conditions of dry etching.

Additionally, the composition for forming an organic film preferably further comprises either or both of a thermal acid generator and a crosslinking agent.

When the inventive composition for forming an organic film contains either or both of a thermal acid generator and a crosslinking agent, the present organic film can be formed with uniform thickness and uniform composition on the organic resist underlayer film, while preventing intermixing with the silicon-containing resist middle layer film to be formed on the organic film.

Additionally, when the composition is applied onto a substrate by spin coating and then heated, the composition preferably can provide an organic film that exhibits a dissolution rate of 5 nm/min or more by treatment with a solution containing 29% ammonia water, 35% hydrogen peroxide water, and water with a ratio of 1:1:8 at 65° C.

The composition for forming an organic film capable of forming an organic film with such properties allows the present organic film and a silicon residue on the present organic film to be removed with ammonia hydrogen peroxide water without causing damage to a semiconductor apparatus manufacturing substrate.

Additionally, the composition preferably can provide an organic film having a thickness of 10 nm or more and less than 100 nm.

The composition for forming an organic film capable of forming such an organic film enables the pattern to be transferred while keeping the accuracy of the pattern formed in the upper layer resist even when the pattern is transferred to the present organic film and the organic resist underlayer film at once by dry etching using the silicon-containing resist middle layer film as a dry etching mask.

The above composition for forming an organic film is capable of forming an organic film that can be easily removed, together with a silicon residue modified by dry etching, in a wet manner with a removing liquid harmless to a semiconductor apparatus substrate and an organic resist underlayer film required in the patterning process, for example, ammonia hydrogen peroxide water called SC1, which is commonly used in the semiconductor manufacturing process. Moreover, when the inventive composition for forming an organic film is applied between an organic resist underlayer film and a silicon-containing resist middle layer film, an ion implantation blocking mask in which no silicon material remains on the pattern can be formed. This can prevent a reduction of the yield in the three-dimensional transistor manufacturing process and enables economical manufacture of a semiconductor apparatus with high performance.

DETAILED DESCRIPTION OF THE PREFERRED EMBODIMENTS

As mentioned above, it is desired to develop a composition for forming an organic film capable of forming an organic film that can be easily removed, together with a silicon residue modified by dry etching, in a wet manner with a removing liquid harmless to a semiconductor apparatus substrate and an organic resist underlayer film required in the patterning process, for example, ammonia hydrogen peroxide water called SC1, which is commonly used in the semiconductor manufacturing process.

The present inventors have earnestly investigated to achieve the above object and consequently found that the problems can be solved by a composition for forming an organic film containing a polymer compound having one or more of repeating units shown by the general formulae (1) to (4); and an organic solvent containing one or more compounds selected from propylene glycol esters, ketones, and lactones with a total concentration of more than 30 wt % with respect to the whole organic solvent, thereby bringing the present invention to completion.

That is, the present invention is a composition for forming an organic film, comprising:

a polymer compound having one or more of repeating units shown by the following general formulae (1) to (4); and an organic solvent containing one or more compounds selected from propylene glycol esters, ketones, and lactones, the compounds having a total concentration of more than 30 wt % with respect to the whole organic solvent,

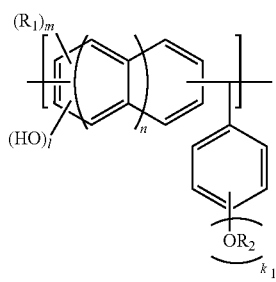

(1)

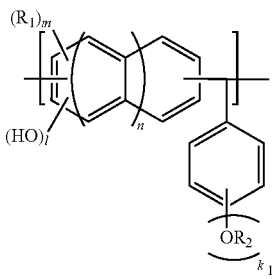

(1)

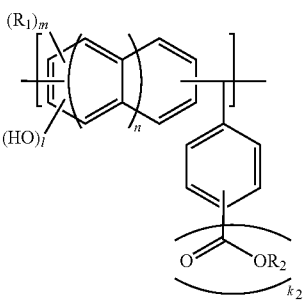

(2)

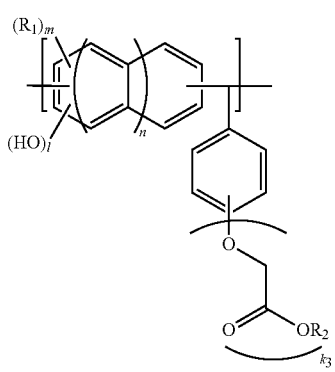

(3)

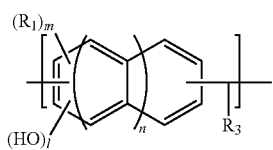

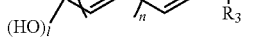

(4)

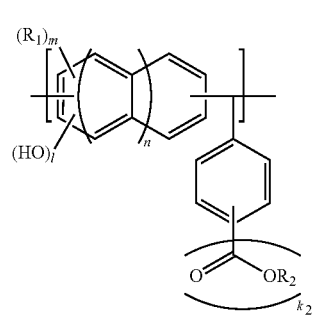

(2)

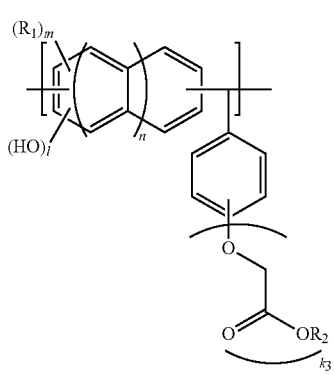

(3)

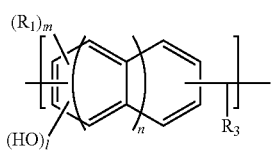

(4)

wherein $R_1$ represents a hydrocarbon group having 1 to 19 carbon atoms, a halogen atom, an alkoxy group, a carboxyl group, a sulfo group, a methoxycarbonyl group, a hydroxyphenyl group, or an amino group; $R_2$ represents a hydrogen atom or AL which is a group capable of generating an acidic functional group by heat or acid; $R_3$ represents a hydrogen atom, a furanyl group, or a hydrocarbon group having 1 to 16 carbon atoms and optionally containing a chlorine atom or a nitro group; $k_1$, $k_2$, and $k_3$ represent 1 or 2; "l" represents 1 to 3; "m" represents 0 to 3; and "n" represents 0 or 1.

Hereinafter, embodiments of the present invention will be described, but the present invention is not limited thereto.

[Composition for Forming Organic Film]

The inventive composition for forming an organic film contains a polymer compound and an organic solvent. Hereinafter, each component will be described in detail.

<Polymer Compound>

The polymer compound in the inventive composition for forming an organic film has one or more of repeating units shown by the following general formulae (1) to (4), wherein $R_1$ represents a hydrocarbon group having 1 to 19 carbon atoms, a halogen atom, an alkoxy group, a carboxyl group, a sulfo group, a methoxycarbonyl group, a hydroxyphenyl group, or an amino group; $R_2$ represents a hydrogen atom or AL which is a group capable of generating an acidic functional group by heat or acid; $R_3$ represents a hydrogen atom, a furanyl group, or a hydrocarbon group having 1 to 16 carbon atoms and optionally containing a chlorine atom or a nitro group; $k_1$, $k_2$, and $k_3$ represent 1 or 2; "l" represents 1 to 3; "m" represents 0 to 3; and "n" represents 0 or 1.

Examples of the repeating unit shown by the general formula (1) include the following structures.
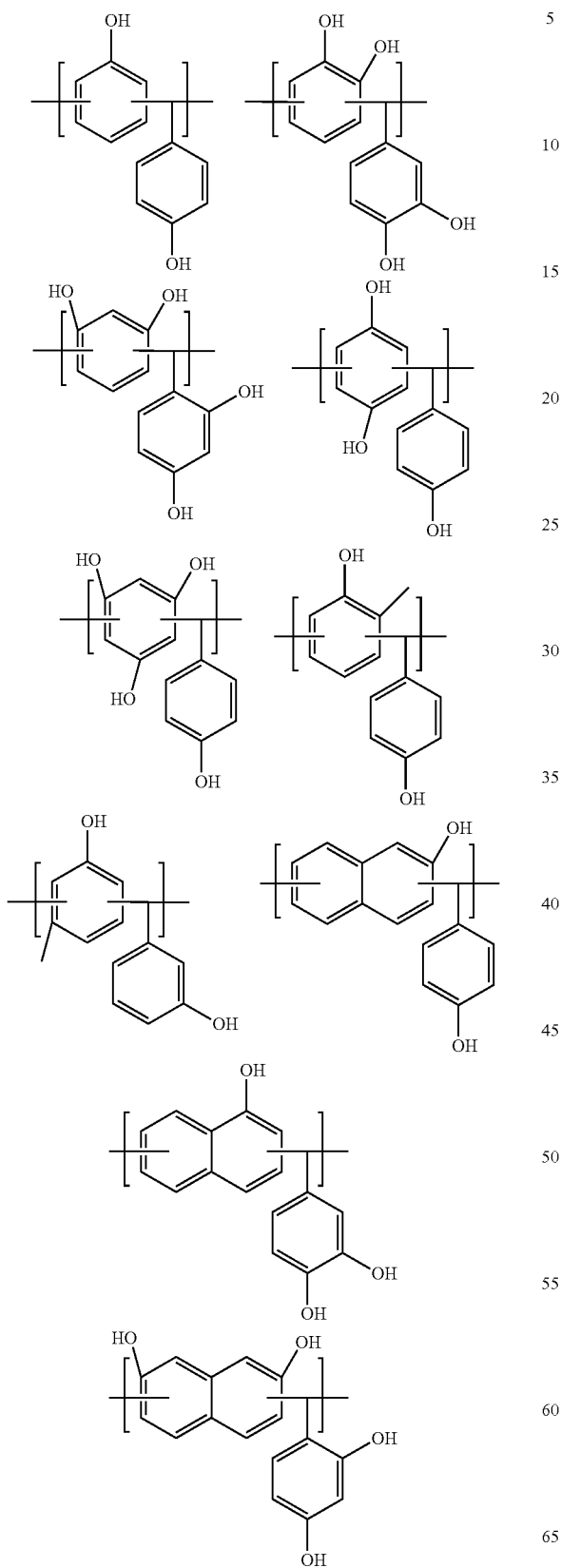
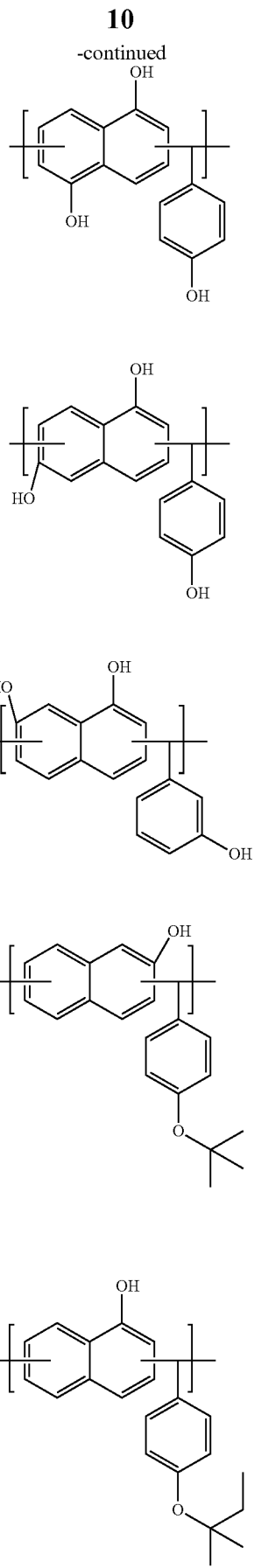

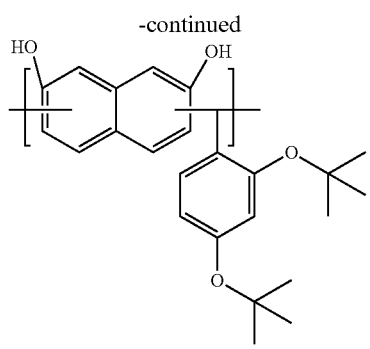
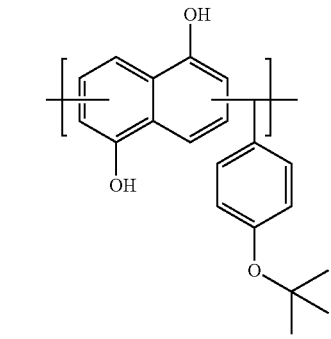
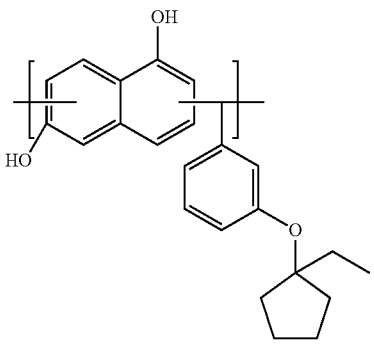
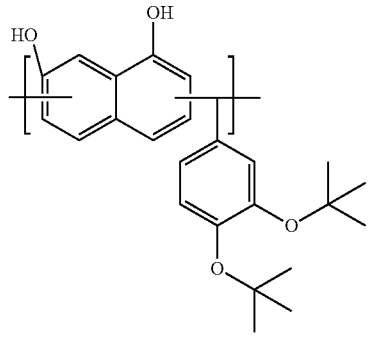
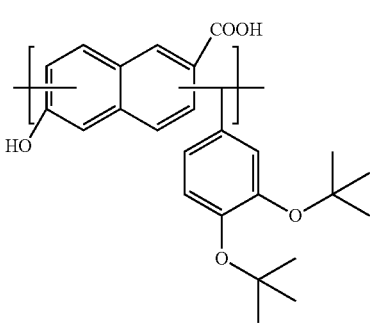
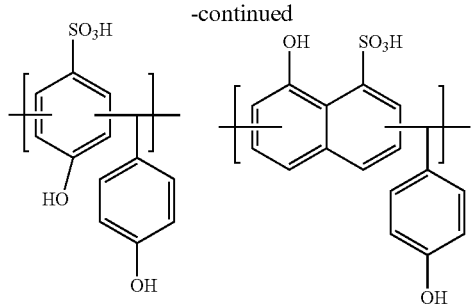
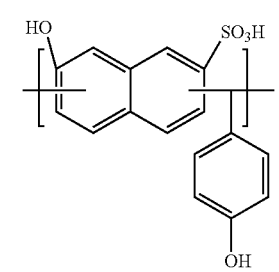
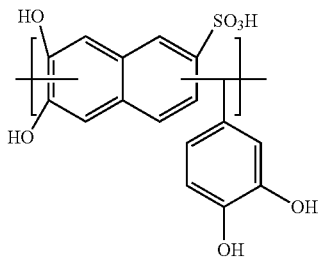
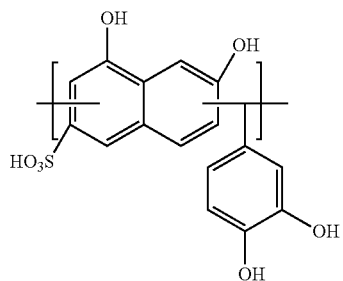
Examples of the repeating unit shown by the general formula (2) include the following structures.
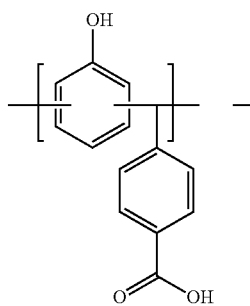
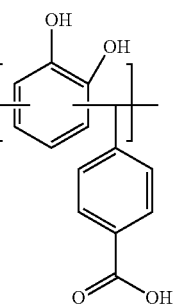

-continued
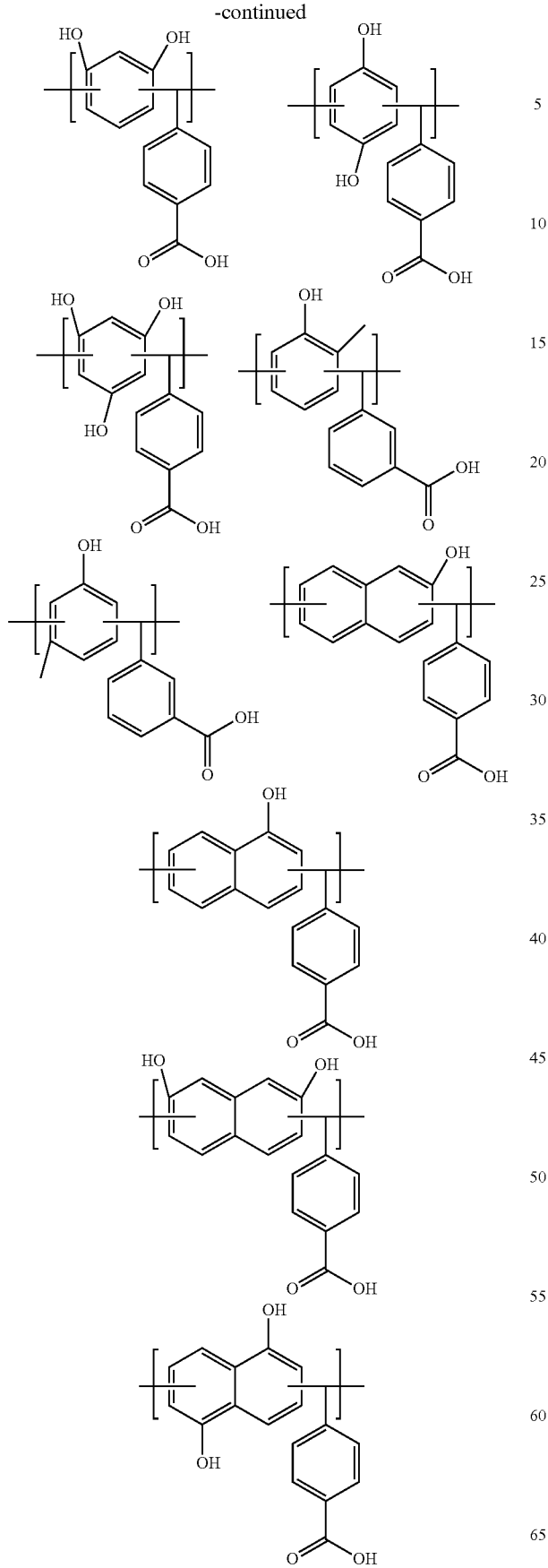
-continued
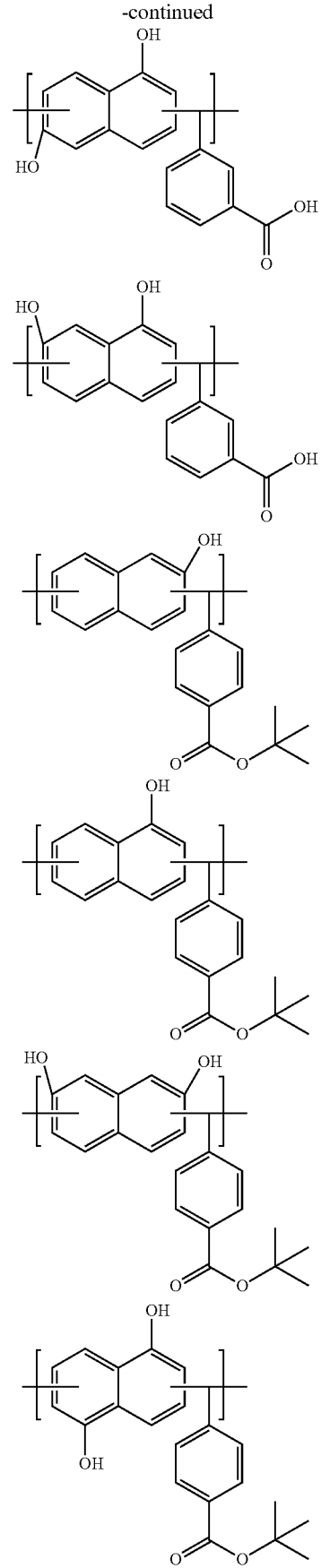

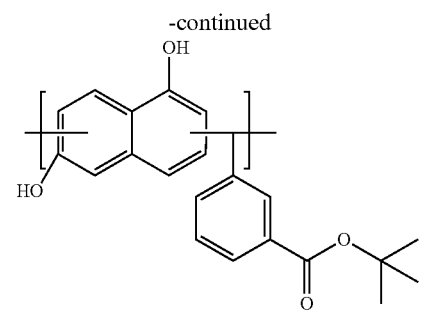
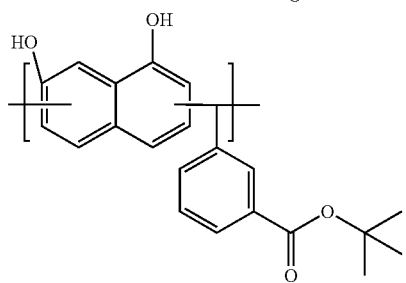
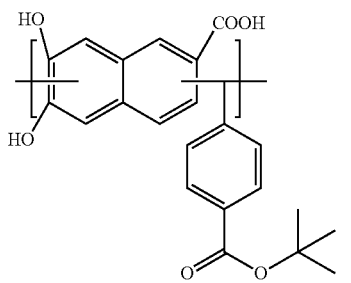
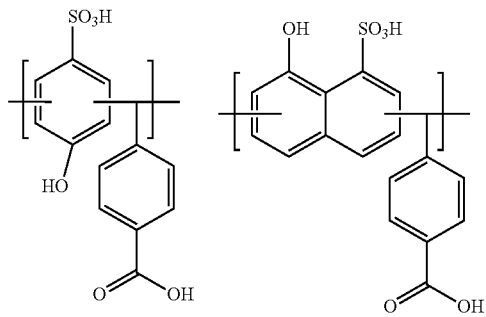
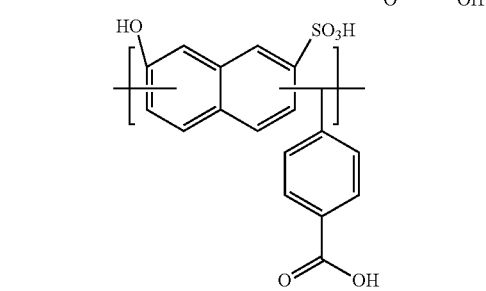
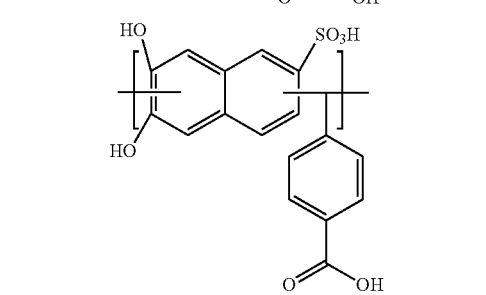
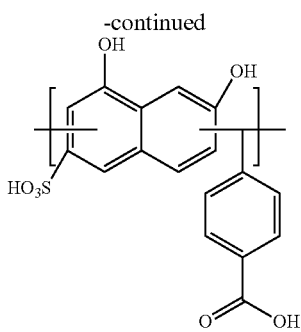
Examples of the repeating unit shown by the general formula (3) include the following structures.
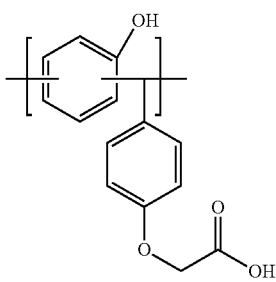
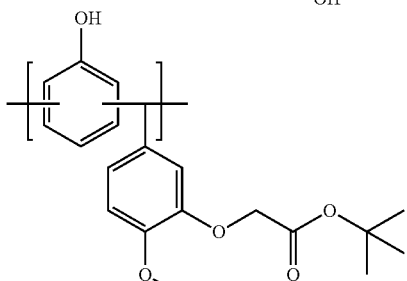
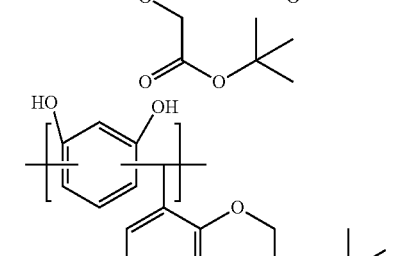
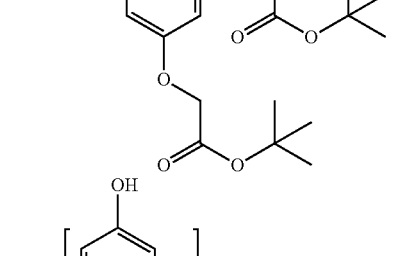
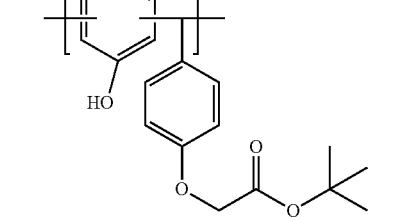

17
-continued
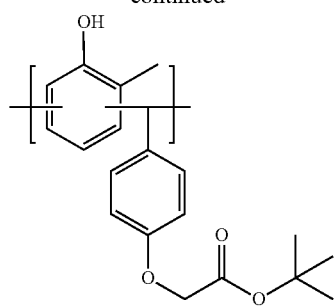
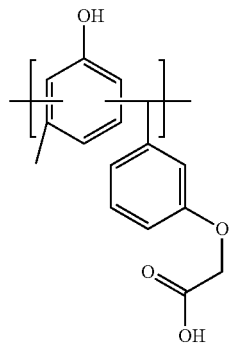
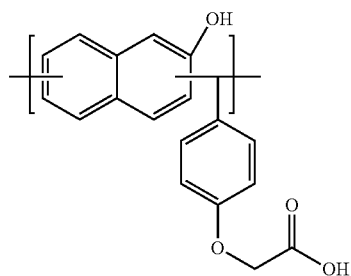
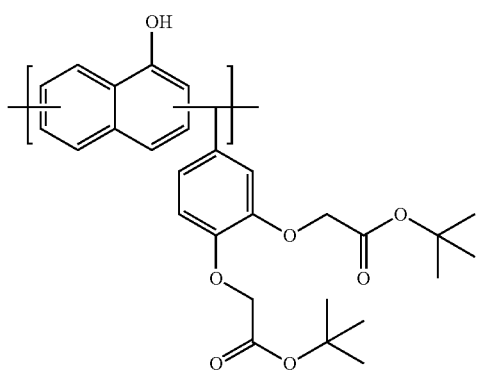
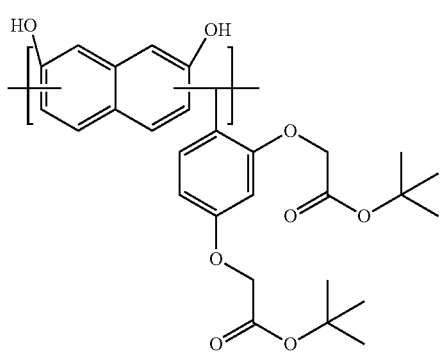
18
-continued
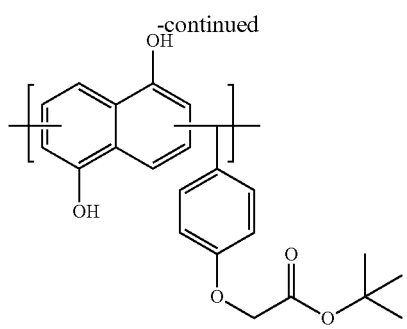
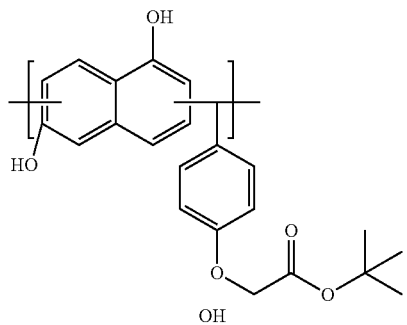
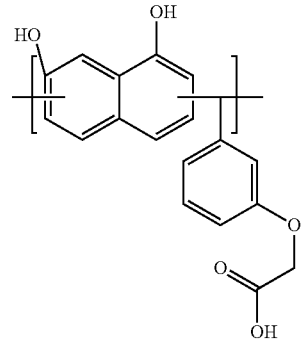
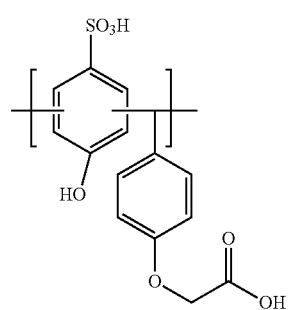
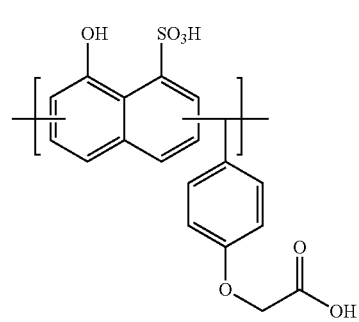

-continued

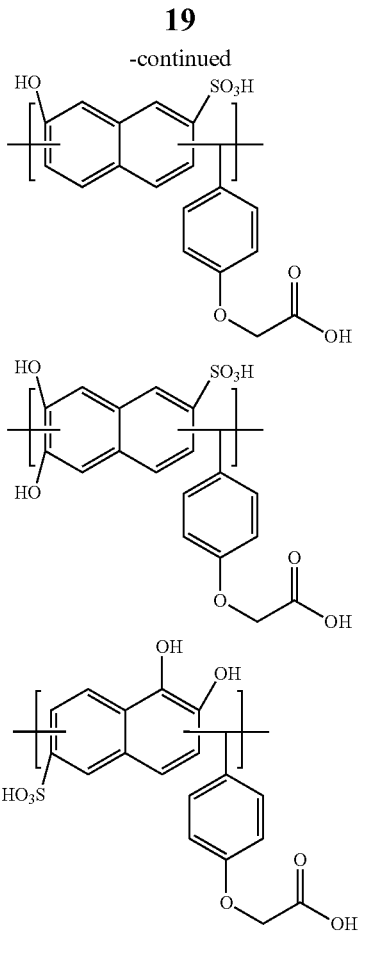

Examples of the repeating unit shown by the general formula (4) include the following structures.

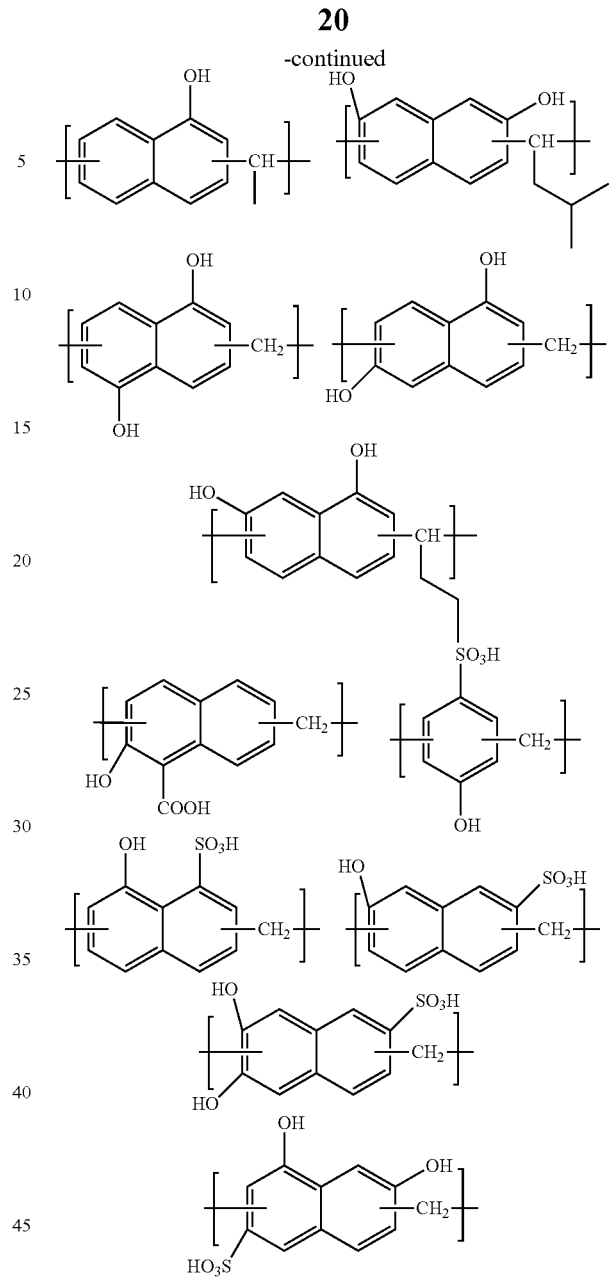

Above all, preferable repeating unit is a structure shown by the general formula (2) or (3). The composition for forming an organic film that contains the polymer compound having such a repeating unit, in which a carboxyl group with high polarity is effectively positioned, can form an organic film having excellent wet-removability in ammonia hydrogen peroxide water.

Examples of monomers that can provide the repeating units shown by the general formulae (1) to (4) in which n=0 include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, 4-phenylphenol, tritylphenol, pyrogallol, thymol, hydroxyphenyl glycidyl ether, 4-fluorophenol, 3,4-difluorophenol, 4-trifluoromethylphenol, 4-chlorophenol, 4-hydroxybenzenesulfonic acid, 4-vinylphenol, and 1-(4-hydroxyphenyl)naphthalene.

Examples of monomers that can provide the repeating units in which n=1 include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 6-(4-hydroxyphenyl)-2-naphthol, 6-(cyclohexyl)-2-naphthol, 1,1'-bi-2,2'-naphthol, 6,6'-bi-2,2'-naphthol, 9,9-bis(6-hydroxy-2-naphthyl)fluorene, 6-hydroxy-2-vinylnaphthalene, 1-hydroxymethylnaphthalene, 2-hydroxymethylnaphthalene, 8-hydroxynaphthalene-1-sulfonic acid, 2-hydroxynaphthalene-7-sulfonic acid, 2,3-dihydroxynaphthalene-7-sulfonic acid, and 1,7-dihydroxynaphthalene-3-sulfonic acid.

These monomers may be used alone, or may be used in combination of two or more kinds to control n-value, k-value, and etching resistance.

As a condensing agent for condensation reaction with these monomers, there may be mentioned the following aldehyde compounds: for example, formaldehyde, trioxane, paraformaldehyde, acetaldehyde, propylaldehyde, butylaldehyde, cyclopentanecarboxaldehyde, cyclopentenecarboxaldehyde, cyclohexanecarboxaldehyde, cyclohexenecarboxaldehyde, norbornanecarboxaldehyde, norbornenecarboxaldehyde, adamantanecarbaldehyde, benzaldehyde, phenylacetaldehyde, α-phenylpropylaldehyde, β-phenylpropylaldehyde, 2-hydroxybenzaldehyde, 3-hydroxybenzaldehyde, 4-hydroxybenzaldehyde, 2,3-dihydroxybenzaldehyde, 2,4-dihydroxybenzaldehyde, 3,4-dihydroxybenzaldehyde, 2-chlorobenzaldehyde, 3-chlorobenzaldehyde, 4-chlorobenzaldehyde, 2-nitrobenzaldehyde, 3-nitrobenzaldehyde, 4-nitrobenzaldehyde, 2-methylbenzaldehyde, 3-methylbenzaldehyde, 4-methylbenzaldehyde, 2-ethylbenzaldehyde, 3-ethylbenzaldehyde, 4-ethylbenzaldehyde, 2-methoxybenzaldehyde, 3-methoxybenzaldehyde, 4-methoxybenzaldehyde, anthracenecarbaldehyde, pyrenecarbaldehyde, and furfural.

As other examples, there may be mentioned compounds shown by the following formulae.

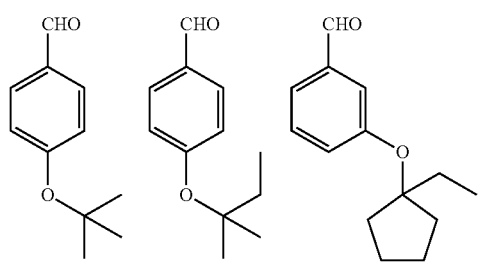

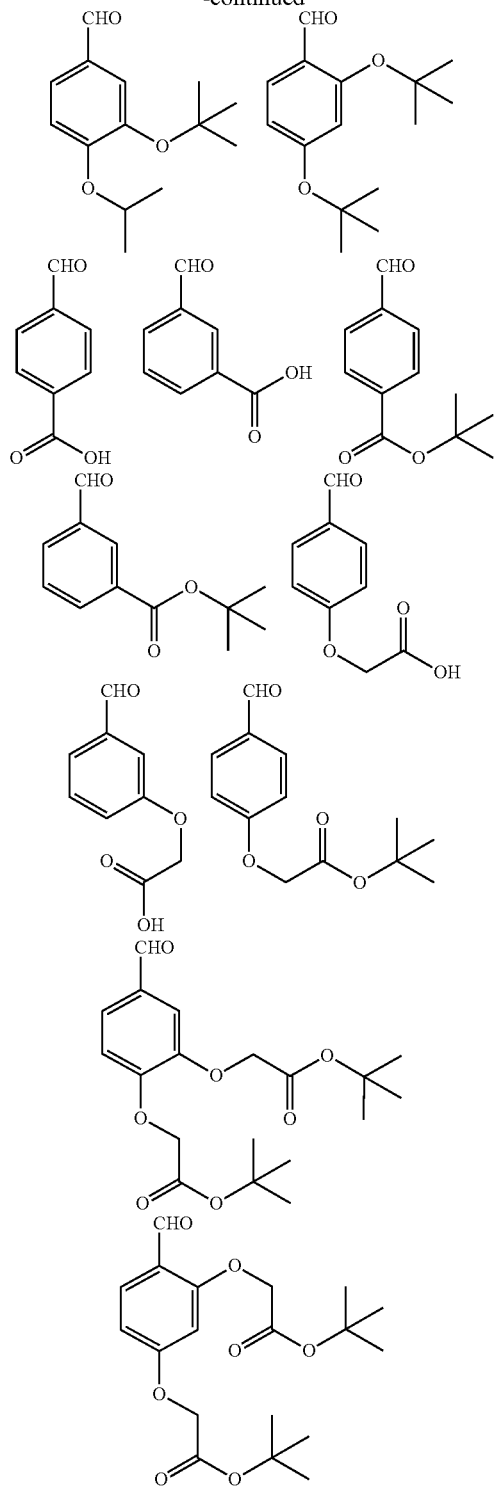

The ratio of the aldehyde compound used as the condensing agent to the monomer is preferably 0.01 to 5 mol, more preferably 0.05 to 2 mol per 1 mol of the total monomer.

The proportion of the repeating unit shown by the general formulae (1) to (4) to all repeating units is preferably 10% or more, more preferably 30% or more, with the whole of repeating units being 100%.

Generally, polycondensation reaction using raw materials as described above can be performed by using an acid or a base as a catalyst without a solvent or in a solvent, at room temperature or, if necessary, under cooling or heating. In this manner, a polymer compound (a polymer) can be obtained. Examples of the solvent to be used include alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-protic polar solvents such as dimethyl sulfoxide, N,N-dimethyl formamide, and hexamethyl phosphoric triamide. These solvents may be used alone or in combination of two or more kinds. These solvents can be used in the range of 0 to 2,000 parts by mass based on 100 parts by mass of the reaction raw materials.

Examples of the acid catalyst include inorganic acids such as hydrochloric acid, hydrobromic acid, sulfuric acid, nitric acid, phosphoric acid, and heteropolyacid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium (IV) oxide. Examples of the base catalyst include inorganic bases such as sodium hydroxide, potassium hydroxide, barium hydroxide, sodium carbonate, sodium hydrogen carbonate, potassium carbonate, lithium hydride, sodium hydride, potassium hydride, and calcium hydride; alkyl metals such as methyl lithium, n-butyl lithium, methyl magnesium chloride, and ethyl magnesium bromide; alkoxides such as sodium methoxide, sodium ethoxide, and potassium t-butoxide; and organic bases such as triethyl amine, diisopropyl ethyl amine, N,N-dimethylaniline, pyridine, and 4-dimethylamino pyridine. The using amount thereof is preferably 0.001 to 100 wt %, preferably 0.005 to 50 wt % with respect to the raw materials. The reaction temperature is preferably about −50° C. to boiling point of the solvent, more preferably room temperature to 100° C.

The polycondensation reaction may be performed by charging the monomers, the condensing agent, and the catalyst all at once or by adding dropwise the monomers and the condensing agent in the presence of the catalyst.

After completion of the polycondensation reaction, an unreacted raw material, catalyst, and so on in the reaction system can be removed by a suitable method, including increasing the temperature of the reaction vessel to 130 to 230° C. at about 1 to 50 mmHg to remove volatile components; adding an appropriate solvent or water to fractionate the polymer; or dissolving the polymer in a good solvent and then reprecipitating the polymer in a poor solvent, depending on characteristics of the obtained reaction product.

With respect to the molecular weight, the polymer thus obtained preferably has a weight average molecular weight (Mw) in terms of polystyrene of 500 to 500,000, particularly preferably 1,000 to 100,000. The molecular weight dispersity is preferably in the range of 1.2 to 20. When monomer components, oligomer components, or low-molecular weight components having a molecular weight (Mw) of 1,000 or less are cut, volatile components can be reduced during baking so that contamination around a baking cup and surface defects due to drop of deposited volatile components on a wafer can be prevented.

<Organic Solvent>

The inventive composition for forming an organic film contains an organic solvent. Illustrative examples of the organic solvent include ketones such as cyclopentanone, cyclohexanone, and methyl-2-amyl ketone; alcohols such as 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, and ethylene glycol monoethyl ether; ethers such as propylene glycol dimethyl ether and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and γ-butyrolactone. These solvents may be used alone or in combination of two or more kinds, although the solvent is not limited thereto.

In the organic solvent, the total concentration of one or more compounds selected from propylene glycol esters, ketones, and lactones (for example, one or more compounds selected from propylene glycol monomethyl ether acetate, cyclopentanone, cyclohexanone, methyl-2-amyl ketone, and γ-butyrolactone of the above-mentioned organic solvents) must be more than 30 wt % with respect to the whole organic solvent. If the organic solvent does not satisfy this requirement, a uniform organic film cannot be formed on the organic resist underlayer film.

To the inventive composition for forming an organic film, an acid generator and a crosslinking agent may be added to further promote crosslinking reaction. The acid generator can be classified into a material that generates an acid by thermal decomposition (a thermal acid generator) and a material that generates an acid by light irradiation; and any acid generators can be added.

Examples of the acid generator include onium salts, diazomethane derivatives, glyoxime derivatives, bissulfone derivatives, sulfonic acid esters of N-hydroxyimide compounds, β-ketosulfone derivatives, disulfone derivatives, nitrobenzylsulfonate derivatives, sulfonates, and sulfonate ester derivatives. More specifically, there may be mentioned materials described in paragraphs (0081) to (0111) of Japanese Unexamined Patent Application Publication No. 2008-65303 (US 2008/0038662 A1).

Examples of the crosslinking agent include melamine compounds, guanamine compounds, glycoluril compounds, or urea compounds substituted with at least one group selected from a methylol group, an alkoxymethyl group, and an acyloxymethyl group, epoxy compounds, thioepoxy compounds, isocyanate compounds, azide compounds, and compounds having a double bond such as an alkenyl ether group. More specifically, there may be mentioned materials described in paragraphs (0074) to (0080) of Japanese Unexamined Patent Application Publication No. 2008-65303 (US 2008/0038662 A1).

Moreover, a surfactant may be added to the inventive composition for forming an organic film to enhance coating property in spin coating. Examples of the surfactant include nonionic surfactants such as polyoxyethylene alkyl ethers, polyoxyethylene alkylallyl ethers, polyoxyethylene polyoxypropylene block copolymers, sorbitan fatty acid esters, and polyoxyethylene sorbitan fatty acid esters, fluorinated surfactants, and partially fluorinated oxetane ring-opening polymer surfactants. More specifically, there may be mentioned materials described in paragraphs (0142) to (0147) of Japanese Unexamined Patent Application Publication No. 2009-269953 (US 2009/0274978 A1).

Furthermore, a basic compound may be added to the inventive composition for forming an organic film to improve storage stability. The basic compound functions as a quencher for acids to prevent crosslinking reaction from progressing by a trace amount of acids generated from the acid generator. Examples of the basic compound include primary, secondary, and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, nitrogen-containing alcoholic compounds, amide derivatives, and imide derivatives. More specifically, there may be mentioned materials described in paragraphs (0112) to (0119) of Japanese Unexamined Patent Application Publication No. 2008-65303 (US 2008/0038662 A1).

The inventive composition for forming an organic film as described above can be suitably used for forming an organic film provided directly under a silicon-containing resist middle layer film soluble in ammonia hydrogen peroxide water and on an organic resist underlayer film difficultly soluble in ammonia hydrogen peroxide water.

Moreover, the inventive composition for forming an organic film preferably can provide an organic film having a thickness of 10 nm or more and less than 100 nm, more preferably 20 nm or more and 80 nm or less. When the thickness of the organic film is 10 nm or more, the silicon material can be sufficiently removed by wet treatment. When the thickness is less than 100 nm, side etching can be prevented at dry etching processing, and failure does not occur during processing.

[Organic Film]

The inventive composition for forming an organic film can form an organic film. The organic film can be formed from the inventive composition, for example, by applying the composition on a substrate to be processed by spin coating or the like. After spin coating, the composition is baked to evaporate the solvent, prevent mixing with a resist upper layer film and a resist middle layer film, and promote crosslinking reaction. Baking is performed at 100° C. or higher and 400° C. or lower, for 10 to 600 seconds, preferably 10 to 300 seconds. The baking temperature is more preferably 150° C. or higher and 350° C. or lower.

As described above, the organic film formed from the inventive composition can be suitably provided directly under a silicon-containing resist middle layer film and on an organic resist underlayer film.

The silicon-containing resist middle layer film is preferably soluble in ammonia hydrogen peroxide water, and can be dissolved or removed with ammonia hydrogen peroxide water. For example, silicon-containing resist underlayer films described in Japanese Unexamined Patent Application Publication No. 2010-085912 (US 2010/0086870 A1), Japanese Unexamined Patent Application Publication No. 2010-085893 (US 2010/0086872 A1), Japanese Unexamined Patent Application Publication No. 2015-028145 (US 2015/0004791 A1), WO 2010/068336 (US 2011/0233489 A1), Japanese Unexamined Patent Application Publication No. 2016-074772 (US 2016/0096977 A1), and Japanese Unexamined Patent Application Publication No. 2016-074774 (US 2016/0096978 A1) are preferably used as the silicon-containing resist middle layer film in the present invention. Above all, films containing either or both of boron and phosphorus have excellent wet-removability in ammonia hydrogen peroxide water and thus are particularly preferable.

In addition, the organic resist underlayer film that can be used in the present invention preferably has resistance to ammonia hydrogen peroxide water (i.e., the film is difficultly soluble in ammonia hydrogen peroxide water). For example, organic resist underlayer films described in Japanese Unexamined Patent Application Publication No. 2004-205685 (U.S. Pat. No. 7,427,464 B2), Japanese Unexamined Patent Application Publication No. 2010-122656 (US 2010/0099044 A1 and US 2013/0184404 A1), Japanese Unexamined Patent Application Publication No. 2012-214720 (US 2012/0252218 A1), and Japanese Unexamined Patent Application Publication No. 2016-094612 (US 2013/0337649 A1) can be used.

The organic resist underlayer film can be formed by applying an organic resist underlayer film composition on a substrate to be processed by spin coating or the like. The spin coating allows the composition to have good filling property. After spin coating, the composition is baked to evaporate the solvent, prevent mixing with a resist upper layer film and a resist middle layer film, and promote crosslinking reaction. Baking is performed at 100° C. or higher and 600° C. or lower, for 10 to 600 seconds, preferably 10 to 300 seconds. The baking temperature is more preferably 200° C. or higher and 500° C. or lower. Considering the effect on device damage and wafer deformation, the upper limit of the heating temperature of wafer process in lithography is preferably 600° C. or lower, more preferably 500° C. or lower.

In the above-described method for forming the organic resist underlayer film, the organic resist underlayer film can be formed by applying the organic resist underlayer film composition on a substrate to be processed by spin coating or the like, and baking and curing the composition in an atmosphere such as air, $N_2$, Ar, or He. Baking the organic resist underlayer film composition in an oxygen-containing atmosphere yields a cured film having resistance to ammonia hydrogen peroxide water.

The above method for forming the organic resist underlayer film provides excellent filling and planarizing properties and makes the cured film flatten regardless of unevenness of a substrate to be processed. It is thus extremely useful for forming a planar cured film on a substrate having a structure or a step with a height of 30 nm or more.

The thickness of the organic resist underlayer film for planarizing and manufacturing a semiconductor apparatus is appropriately selected, and preferably 5 to 500 nm, particularly preferably 10 to 400 nm.

When the inventive composition is used for forming an organic film provided directly under a silicon-containing resist middle layer film and on an organic resist underlayer film to form an ion implantation blocking mask, a removing liquid containing hydrogen peroxide is preferably used for removing the organic film and the silicon-containing resist middle layer film in a wet manner. At this time, an acid or an alkali is preferably added to the removing liquid to adjust pH and promote the removal. Examples of the pH adjuster (the acid or the alkali) include inorganic acids such as hydrochloric acid and sulfuric acid, organic acids such as acetic acid, oxalic acid, tartaric acid, citric acid, and lactic acid, nitrogen-containing alkalis such as ammonia, ethanolamine, and tetramethylammonium hydroxide, and nitrogen-containing organic acid compounds such as EDTA (ethylenediamine tetraacetic acid). In particular, ammonia is preferable. That is, the removing liquid is preferably ammonia hydrogen peroxide water.

When ammonia hydrogen peroxide water is used as the removing liquid, the ratio of ammonia, hydrogen peroxide, and dilution deionized water is as follows: ammonia is 0.01 to 20 parts by mass, preferably 0.05 to 15 parts by mass, more preferably 0.1 to 10 parts by mass, and hydrogen peroxide is 0.01 to 20 parts by mass, preferably 0.05 to 15 parts by mass, more preferably 0.1 to 10 parts by mass, based on 100 parts by mass of deionized water.

The wet-removal can be performed by preparing a removing liquid of 0° C. to 80° C., preferably 5° C. to 70° C., and soaking a silicon wafer having a target substrate to be processed in the removing liquid. If necessary, the removing liquid may be sprayed on the surface, or the removing liquid may be applied while rotating the wafer according to a usual method to easily remove the silicon-containing resist middle layer film and the organic film formed from the inventive composition.

In particular, when the inventive composition is applied onto a substrate by spin coating and then heated, the composition preferably can provide an organic film that exhibits a dissolution rate of 5 nm/min or more by treatment with a solution containing 29% ammonia water, 35% hydrogen peroxide water, and water with a ratio of 1:1:8 at 65° C.

After treatment with ammonia hydrogen peroxide water, the amount of the removed silicon material is preferably checked by quantifying the silicon material remaining on the surface of the organic resist underlayer film. For example, analysis can be carried out by a method described in Japanese Unexamined Patent Application Publication No. 2016-177262 (US 2016/0276152 A1).

As described above, the inventive composition for forming an organic film is capable of forming an organic film that can be easily removed, together with a silicon residue modified by dry etching, in a wet manner with a removing liquid harmless to a semiconductor apparatus substrate and an organic resist underlayer film required in the patterning process, for example, ammonia hydrogen peroxide water called SC1, which is commonly used in the semiconductor manufacturing process. Moreover, when the inventive composition for forming an organic film is applied between the organic resist underlayer film and the silicon-containing resist middle layer film, an ion implantation blocking mask in which no silicon material remains on the pattern can be formed. This can prevent a reduction of the yield in the three-dimensional transistor manufacturing process and enables economical manufacture of a semiconductor apparatus with high performance.

EXAMPLES

Hereinafter, the present invention will be specifically described with reference to Synthesis Examples, Examples and Comparative Examples, but the present invention is not limited thereto. In the following examples, % means mass %, and molecular weight measurement was carried out by GPC. In GPC measurement, detection was performed by RI using tetrahydrofuran as an eluent, and molecular weight was determined in terms of polystyrene.

[Synthesis of Polymer Compound]

Synthesis Example (A1)

A 500-mL three-necked flask was charged with 40.00 g (0.36 mol) of resorcinol, 10.00 g of a PGME solution containing 20 mass % p-toluenesulfonic acid monohydrate, and 72.00 g of 2-methoxy-1-propanol, and the mixture was heated to 80° C. under stirring. 23.59 g of 37% formalin (0.29 mol of formaldehyde) was added thereto, followed by stirring for 11 hours. The reaction solution was then mixed with 160 g of ultrapure water and 200 g of ethyl acetate, transferred to a separation funnel, and washed with 150 g of ultrapure water 10 times to remove the acid catalyst and metal impurities. The obtained organic layer was condensed under reduced pressure to be 76 g, ethyl acetate was added thereto to form 150 g of a solution, and 217 g of n-hexane was added to the solution. Consequently, the n-hexane layer and the high-concentration polymer solution were respectively separated into an upper layer and a lower layer, and the upper layer was removed. The same operation was repeated twice, and the obtained polymer solution was condensed and dried under reduced pressure at 80° C. for 13 hours to obtain Polymer compound A1. GPC measurement showed that the compound had a weight average molecular weight (Mw) of 800 and a dispersity (Mw/Mn) of 1.3. Polymer compound A1 had the repeating unit shown by the general formula (4).

Synthesis Example (A2)

A 1,000-mL three-necked flask was charged with 80.1 g (0.50 mol) of 1,5-dihydroxynaphthalene, 26.4 g (0.24 mol) of a 37% formalin solution, and 250 g of 2-methoxy-1-propanol in a nitrogen atmosphere to form a homogeneous solution with a liquid temperature of 80° C. To the solution was gently added 18 g of a 2-methoxy-1-propanol solution containing 20% p-toluenesulfonic acid, and the mixture was stirred at 110° C. for 12 hours. After cooling to room temperature, 500 g of methyl isobutyl ketone was added, and the organic layer was washed with 200 g of pure water 5 times and then evaporated under reduced pressure to dryness. Then, 300 mL of THF was added to the residue, and a polymer was precipitated by 2,000 mL of hexane. The precipitated polymer was collected by filtration and dried under reduced pressure to obtain Polymer compound A2. GPC measurement showed that the compound had a weight average molecular weight (Mw) of 3,000 and a dispersity (Mw/Mn) of 2.7. Polymer compound A2 had the repeating unit shown by the general formula (4).

Synthesis Example (A3)

A 2,000-mL three-necked flask was charged with 80.1 g (0.50 mol) of 1,5-dihydroxynaphthalene, 100.1 g (0.40 mol) of 3,4-di-t-butoxybenzaldehyde, and 600 g of 2-methoxy-1-propanol in a nitrogen atmosphere to form a homogeneous solution with a liquid temperature of 80° C. To the solution was gently added 6.4 g of a 25% sodium hydroxide aqueous solution, and the mixture was stirred at 110° C. for 24 hours. After cooling to room temperature, 1,500 g of ethyl acetate was added, and the organic layer was washed with 300 g of a 3% nitric acid aqueous solution, further washed with 300 g of pure water 5 times, and then evaporated under reduced pressure to dryness. Then, 400 mL of THF was added to the residue, and a polymer was precipitated by 3,000 mL of hexane. The precipitated polymer was collected by filtration and dried under reduced pressure to obtain Polymer compound A3. GPC measurement showed that the compound had a weight average molecular weight (Mw) of 2,900 and a dispersity (Mw/Mn) of 2.9. Polymer compound A3 had the repeating unit shown by the general formula (1).

Synthesis Example (A4)

A 1,000-mL flask was charged with 80 g (0.50 mol) of 1,5-dihydroxynaphthalene, 36.6 g (0.30 mol) of 4-hydroxybenzaldehyde, and 145 g of methyl cellosolve. Then, 20 g of a methyl cellosolve solution containing 20 mass % p-toluenesulfonic acid was added thereto under stirring at 70° C. The solution was then heated to 85° C. and stirred for 6 hours. After cooling to room temperature, the solution was diluted with 800 mL of ethyl acetate. The solution was then transferred to a separation funnel, and repeatedly washed with 200 mL of deionized water to remove the reaction catalyst and metal impurities. After the obtained solution was condensed under reduced pressure, 600 mL of ethyl acetate was added to the residue, and a polymer was precipitated by 2,400 mL of hexane. The precipitated polymer was collected by filtration and dried under reduced pressure to obtain Polymer compound A4. GPC measurement showed that the compound had a weight average molecular weight (Mw) of 3,800 and a dispersity (Mw/Mn) of 2.4. Polymer compound A4 had the repeating unit shown by the general formula (1).

Synthesis Example (A5)

A 2,000-mL three-necked flask was charged with 80.1 g (0.50 mol) of 2,7-dihydroxynaphthalene, 100.1 g (0.40 mol) of t-butyl terephthalaldehydate, and 600 g of 2-methoxy-1-propanol in a nitrogen atmosphere to form a homogeneous solution with a liquid temperature of 80° C. To the solution was gently added 6.4 g of a 25% sodium hydroxide aqueous solution, and the mixture was stirred at 110° C. for 24 hours. After cooling to room temperature, 1,500 g of ethyl acetate was added, and the organic layer was washed with 300 g of a 3% nitric acid aqueous solution, further washed with 300 g of pure water 5 times, and then evaporated under reduced pressure to dryness. Then, 400 mL of THF was added to the residue, and a polymer was precipitated by 3,000 mL of hexane. The precipitated polymer was collected by filtration and dried under reduced pressure to obtain Polymer compound A5. GPC measurement showed that the compound had a weight average molecular weight (Mw) of 2,900 and a dispersity (Mw/Mn) of 2.9. Polymer compound A5 had the repeating unit shown by the general formula (2).

Synthesis Example (A6)

A 2,000-mL three-necked flask was charged with 94.4 g (0.50 mol) of 6-hydroxy-2-naphthoic acid, 100.1 g (0.40 mol) of t-butyl terephthalaldehydate, and 600 g of 2-methoxy-1-propanol in a nitrogen atmosphere to form a homogeneous solution with a liquid temperature of 80° C. To the solution was gently added 6.4 g of a 25% sodium hydroxide aqueous solution, and the mixture was stirred at 110° C. for 24 hours. After cooling to room temperature, 1,500 g of ethyl acetate was added, and the organic layer was washed with 300 g of a 3% nitric acid aqueous solution, further washed with 300 g of pure water 5 times, and then evaporated under reduced pressure to dryness. Then, 400 mL of THF was added to the residue, and a polymer was precipitated by 3,000 mL of hexane. The precipitated polymer was collected by filtration and dried under reduced pressure to obtain Polymer compound A6. GPC measurement showed that the compound had a weight average molecular weight (Mw) of 3,500 and a dispersity (Mw/Mn) of 2.8. Polymer compound A6 had the repeating unit shown by the general formula (2).

Synthesis Example (A7)

A 2,000-mL three-necked flask was charged with 80.1 g (0.50 mol) of 1,5-dihydroxynaphthalene, 60.1 g (0.40 mol) of terephthalaldehydic acid, and 600 g of 2-methoxy-1-propanol in a nitrogen atmosphere to form a homogeneous solution with a liquid temperature of 80° C. To the solution was gently added 6.4 g of a 25% sodium hydroxide aqueous solution, and the mixture was stirred at 110° C. for 24 hours. After cooling to room temperature, 1,500 g of ethyl acetate was added, and the organic layer was washed with 300 g of a 3% nitric acid aqueous solution, further washed with 300 g of pure water 5 times, and then evaporated under reduced pressure to dryness. Then, 400 mL of THF was added to the residue, and a polymer was precipitated by 3,000 mL of hexane. The precipitated polymer was collected by filtration and dried under reduced pressure to obtain Polymer compound A7. GPC measurement showed that the compound had a weight average molecular weight (Mw) of 2,200 and a dispersity (Mw/Mn) of 2.9. Polymer compound A7 had the repeating unit shown by the general formula (2).

Synthesis Example (A8)

A 200-mL three-necked flask was charged with 9.4 g (0.05 mol) of 6-hydroxy-2-naphthoic acid, 5.3 g (0.05 mol) of terephthalaldehydic acid, and 60 g of 2-methoxy-1-propanol in a nitrogen atmosphere to form a homogeneous solution with a liquid temperature of 80° C. To the solution was gently added 0.6 g of a 25% sodium hydroxide aqueous solution, and the mixture was stirred at 110° C. for 24 hours. After cooling to room temperature, 150 g of ethyl acetate was added, and the organic layer was washed with 30 g of a 3% nitric acid aqueous solution, further washed with 30 g of pure water 5 times, and then evaporated under reduced pressure to dryness. Then, 40 mL of THF was added to the residue, and a polymer was precipitated by 300 mL of hexane. The precipitated polymer was collected by filtration and dried under reduced pressure to obtain Polymer compound A8. GPC measurement showed that the compound had a weight average molecular weight (Mw) of 2,000 and a dispersity (Mw/Mn) of 2.6. Polymer compound A8 had the repeating unit shown by the general formula (2).

Synthesis Example (A9)

A 2,000-mL three-necked flask was charged with 54.1 g (0.50 mol) of o-cresol, 140.2 g (0.40 mol) of 3,4-bis(t-butoxycarbonylmethoxy)benzaldehyde, and 600 g of 2-methoxy-1-propanol in a nitrogen atmosphere to form a homogeneous solution with a liquid temperature of 80° C. To the solution was gently added 6.4 g of a 25% sodium hydroxide aqueous solution, and the mixture was stirred at 110° C. for 24 hours. After cooling to room temperature, 1,500 g of ethyl acetate was added, and the organic layer was washed with 300 g of a 3% nitric acid aqueous solution, further washed with 300 g of pure water 5 times, and then evaporated under reduced pressure to dryness. Then, 400 mL of THF was added to the residue, and a polymer was precipitated by 3,000 mL of hexane. The precipitated polymer was collected by filtration and dried under reduced pressure to obtain Polymer compound A9. GPC measurement showed that the compound had a weight average molecular weight (Mw) of 3,200 and a dispersity (Mw/Mn) of 3.0. Polymer compound A9 had the repeating unit shown by the general formula (3).

Synthesis Example (A10)

A 2,000-mL three-necked flask was charged with 80.1 g (0.50 mol) of 1,6-dihydroxynaphthalene, 94.5 g (0.40 mol) of 4-t-butoxycarbonylmethoxybenzaldehyde, and 600 g of 2-methoxy-1-propanol in a nitrogen atmosphere to form a homogeneous solution with a liquid temperature of 80° C. To the solution was gently added 6.4 g of a 25% sodium hydroxide aqueous solution, and the mixture was stirred at 110° C. for 24 hours. After cooling to room temperature, 1,500 g of ethyl acetate was added, and the organic layer was washed with 300 g of a 3% nitric acid aqueous solution, further washed with 300 g of pure water 5 times, and then evaporated under reduced pressure to dryness. Then, 400 mL of THF was added to the residue, and a polymer was precipitated by 3,000 mL of hexane. The precipitated polymer was collected by filtration and dried under reduced pressure to obtain Polymer compound A10. GPC measurement showed that the compound had a weight average molecular weight (Mw) of 2,700 and a dispersity (Mw/Mn) of 2.7. Polymer compound A10 had the repeating unit shown by the general formula (3).

EXAMPLES AND COMPARATIVE EXAMPLES

Polymer compounds A1 to A10 and additives, namely, crosslinking agents XL1 to 3, thermal acid generator AG1, and an organic solvent containing 0.1 mass % FC-4430 (available from Sumitomo 3M Ltd.) as a surfactant were mixed in a proportion shown in Table 1, and filtered through a 0.1 μm filter made of fluorinated resin to prepare compositions for forming an organic film (Sols. 1 to 22). Sols. 1 to 10, 15 to 16, and 20 to 22 are compositions for forming an organic film of the present invention, whereas Sols. 11 to 14 and 17 to 19 are comparative compositions for forming an organic film. Table 1 also shows the total amount of one or more compounds selected from propylene glycol esters, ketones, and lactones in the whole organic solvent in the prepared composition for forming an organic film.

TABLE 1

| No. | Polymer compound (part by mass) | Additive | | | Total amount of propylene glycol ester, ketone, and lactone in whole organic solvent (wt %) |
| --- | --- | --- | --- | --- | --- |
| | | Thermal acid generator (part by mass) | Cross-linking agent (part by mass) | Organic solvent (part by mass) | |
| Sol. 1 | A1 (100) | AG1 (2) | XL1 (10) | PGMEA (1600) | 100 |
| Sol. 2 | A2 (100) | AG1 (2) | XL1 (10) | PGMEA/ Cyho (1100/500) | 100 |
| Sol. 3 | A3 (100) | AG1 (2) | XL2 (10) | PGMEA (1600) | 100 |
| Sol. 4 | A4 (100) | | | PGMEA/ PGEE (500/1100) | 31.3 |
| Sol. 5 | A5 (100) | AG1 (2) | | PGMEA/ GBL (1100/500) | 100 |
| Sol. 6 | A6 (100) | AG1 (2) | XL3 (10) | PGMEA (1600) | 100 |
| Sol. 7 | A7 (100) | AG1 (2) | | PGMEA/ PGEE (500/1100) | 31.3 |
| Sol. 8 | A8 (100) | AG1 (2) | XL2 (10) | PGMEA/ PGEE (500/1100) | 31.3 |
| Sol. 9 | A9 (100) | AG1 (2) | | PGMEA/ PGEE (500/1100) | 31.3 |
| Sol. 10 | A10 (100) | AG1 (2) | | PGMEA/ PGEE (500/1100) | 31.3 |
| Sol. 11 | A4 (100) | | | PGMEA/ 4M2P (160/1440) | 10 |
| Sol. 12 | A4 (100) | | | PGMEA/ 4M2P (320/1280) | 20 |
| Sol. 13 | A4 (100) | | | PGMEA/ 4M2P (400/1200) | 25 |
| Sol. 14 | A4 (100) | | | PGMEA/ 4M2P (480/1120) | 30 |
| Sol. 15 | A4 (100) | | | PGMEA/ 4M2P (640/960) | 40 |
| Sol. 16 | A4 (100) | | | PGMEA/ 4M2P (960/640) | 60 |
| Sol. 17 | A2 (100) | AG1 (2) | XL1 (10) | PGEE (1600) | 0 |
| Sol. 18 | A4 (100) | | | 4M2P (1600) | 0 |
| Sol. 19 | A7 (100) | AG1 (2) | | 4M2P (1600) | 0 |
| Sol. 20 | A2 (100) | AG1 (2) | XL1 (10) | PGMEA (3920) | 100 |
| Sol. 21 | A2 (100) | AG1 (2) | XL1 (10) | PGMEA (390) | 100 |
| Sol. 22 | A2 (100) | AG1 (2) | XL1 (10) | PGMEA (260) | 100 |

Thermal acid generator AG1 and crosslinking agents XL1 to 3 are shown below.

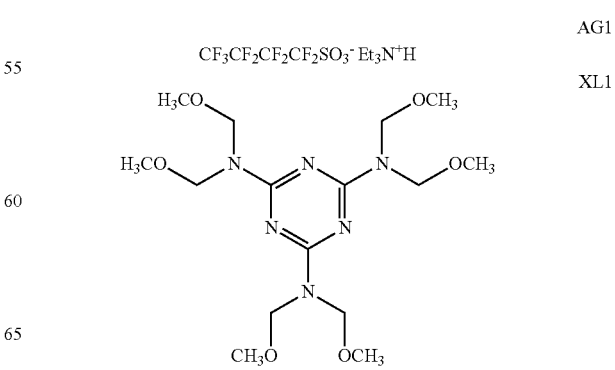

-continued

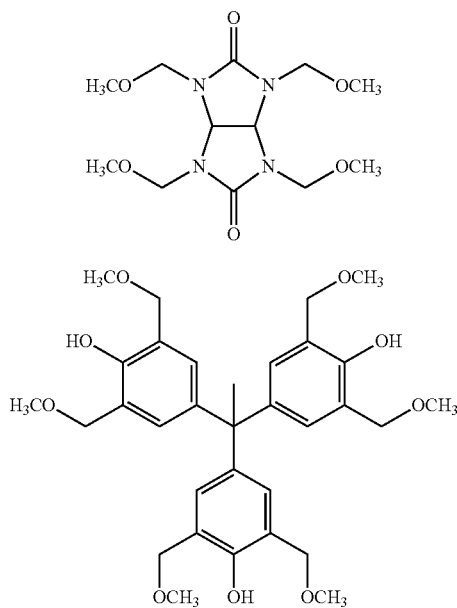

XL2

XL3

The organic solvents in Table 1 are as follows.
PGMEA: propylene glycol methyl ether acetate
Cyho: cyclohexanone
PGEE: propylene glycol ethyl ether
GBL: γ-butyrolactone
4M2P: 4-methyl-2-pentanol Solvent Resistance Evaluation: Examples 1-1 to 15, Comparative Examples 1-1 to 7

On the organic film formed from the inventive composition, a silicon-containing resist middle layer film is formed by spin coating. Thus, resistance to an organic solvent was evaluated to determine whether the formed organic film causes intermixing. The compositions for forming an organic film (Sols. 1 to 22) were each applied on a silicon substrate and baked at 285° C. for 60 seconds to form an organic film, and thickness T1 was measured. Then, a solvent (PGMEA/PGME=30/70 (mass ratio)) was applied on the obtained organic film by spin coating, and baked at 100° C. for 30 seconds, and thickness T2 was measured. From these measurement results, the reduction in thickness expressed by T1-T2 was calculated. The result is given in Table 2.

TABLE 2

| | Composition for forming organic film | Film thickness after baking at 285° C. T1(nm) | Film thickness after rinsing T2(nm) | T1 – T2 (nm) |
|---|---|---|---|---|
| Example 1-1 | Sol. 1 | 24.9 | 24.8 | 0.1 |
| Example 1-2 | Sol. 2 | 25.4 | 25.4 | 0.0 |
| Example 1-3 | Sol. 3 | 25.0 | 24.9 | 0.1 |
| Example 1-4 | Sol. 4 | 25.3 | 25.1 | 0.2 |
| Example 1-5 | Sol. 5 | 25.3 | 25.3 | 0.0 |
| Example 1-6 | Sol. 6 | 25.3 | 25.3 | 0.0 |
| Example 1-7 | Sol. 7 | 25.1 | 25.3 | −0.2 |
| Example 1-8 | Sol. 8 | 24.9 | 24.8 | 0.1 |
| Example 1-9 | Sol. 9 | 25.0 | 25.1 | −0.1 |
| Example 1-10 | Sol. 10 | 24.7 | 24.7 | 0.0 |
| Example 1-11 | Sol. 15 | 25.3 | 25.1 | −0.2 |

TABLE 2-continued

| | Composition for forming organic film | Film thickness after baking at 285° C. T1(nm) | Film thickness after rinsing T2(nm) | T1 – T2 (nm) |
|---|---|---|---|---|
| Example 1-12 | Sol. 16 | 25.2 | 25.1 | −0.1 |
| Example 1-13 | Sol. 20 | 9.8 | 9.9 | 0.1 |
| Example 1-14 | Sol. 21 | 100.3 | 100.1 | −0.2 |
| Example 1-15 | Sol. 22 | 150.2 | 150.1 | −0.1 |
| Comparative example 1-1 | Sol. 11 | 25.0 | 25.0 | 0.0 |
| Comparative example 1-2 | Sol. 12 | 24.9 | 25.0 | −0.1 |
| Comparative example 1-3 | Sol. 13 | 25.0 | 25.1 | −0.1 |
| Comparative example 1-4 | Sol. 14 | 25.1 | 25.0 | −0.1 |
| Comparative example 1-5 | Sol. 17 | 25.1 | 25.2 | −0.1 |
| Comparative example 1-6 | Sol. 18 | 25.0 | 24.7 | 0.3 |
| Comparative example 1-7 | Sol. 19 | 25.3 | 25.5 | −0.2 |

As can be seen from Examples 1-1 to 15 in Table 2, the organic films formed from Sols. 1 to 10, 15 to 16, and 20 to 22 had sufficient organic solvent resistance. This indicates that these organic films allow a silicon-containing resist middle layer film to be formed thereon by spin coating without intermixing.

Evaluation of Film Formation on Organic Resist Underlayer Film: Examples 2-1 to 15, Comparative Examples 2-1 to 7

The organic film formed from the inventive composition is laminated on an organic resist underlayer film. Thus, the film forming property on the organic resist underlayer film was determined. Spin-on carbon film ODL-102, available from Shin-Etsu Chemical Co., Ltd., was formed with a thickness of 200 nm on a silicon wafer as an organic resist underlayer film. The composition for forming an organic film (Sols. 1 to 22) was applied thereon and baked at 285° C. for 60 seconds to form an organic film, and the film-forming condition of the organic film was observed. The result is given in Table 3.

TABLE 3

| | Composition for forming organic film | Film formation |
|---|---|---|
| Example 2-1 | Sol. 1 | no film formation failure |
| Example 2-2 | Sol. 2 | no film formation failure |
| Example 2-3 | Sol. 3 | no film formation failure |
| Example 2-4 | Sol. 4 | no film formation failure |
| Example 2-5 | Sol. 5 | no film formation failure |
| Example 2-6 | Sol. 6 | no film formation failure |
| Example 2-7 | Sol. 7 | no film formation failure |
| Example 2-8 | Sol. 8 | no film formation failure |
| Example 2-9 | Sol. 9 | no film formation failure |
| Example 2-10 | Sol. 10 | no film formation failure |
| Example 2-11 | Sol. 15 | no film formation failure |
| Example 2-12 | Sol. 16 | no film formation failure |
| Example 2-13 | Sol. 20 | no film formation failure |
| Example 2-14 | Sol. 21 | no film formation failure |
| Example 2-15 | Sol. 22 | no film formation failure |
| Comparative example 2-1 | Sol. 11 | film formation failure occurs due to repellence |
| Comparative example 2-2 | Sol. 12 | film formation failure occurs due to repellence |

TABLE 3-continued

| | Composition for forming organic film | Film formation |
|---|---|---|
| Comparative example 2-3 | Sol. 13 | film formation failure occurs due to repellence |
| Comparative example 2-4 | Sol. 14 | film formation failure occurs due to repellence |
| Comparative example 2-5 | Sol. 17 | film formation failure occurs due to repellence |
| Comparative example 2-6 | Sol. 18 | film formation failure occurs due to repellence |
| Comparative example 2-7 | Sol. 19 | film formation failure occurs due to repellence |

As can be seen from Examples 2-1 to 15 in Table 3, Sols. 1 to 10, 15 to 16, and 20 to 22 could form a film on the organic resist underlayer film by spin coating without film formation failure. By contrast, as can be seen from Comparative examples 2-1 to 7, Sols. 11 to 14 and 17 to 19 containing 70 wt % or more of an alcoholic organic solvent could not form a film on the organic resist underlayer film due to repellence.

Wet-Removability of Organic Film with Ammonia Hydrogen Peroxide Water: Examples 3-1 to 12

The compositions for forming an organic film (Sols. 1 to 10 and 15 to 16) were each applied on a silicon substrate and baked at 285° C. for 60 seconds such that an organic film was formed with a thickness of 25 nm, and thickness T1 was measured. This film was soaked in 65° C. of ammonia hydrogen peroxide water in which 29% ammonia water, 35% hydrogen peroxide water, and water have been mixed with a ratio of 1:1:8 for 5 minutes. The film was then washed with pure water and dried by heating at 100° C. for 60 seconds, and thickness T3 was measured. Moreover, the film removal rate was determined. The result is given in Table 4.

TABLE 4

| Composition for forming organic film | Film thickness after baking at 285° C. T1(nm) | Film thickness after treatment with ammonia hydrogen peroxide water T3(nm) | Film removal rate (nm/min) |
|---|---|---|---|
| Example 3-1 | Sol. 1 | 24.9 | no residual film | ≥5 |
| Example 3-2 | Sol. 2 | 25.4 | no residual film | ≥5 |
| Example 3-3 | Sol. 3 | 25.0 | no residual film | ≥5 |
| Example 3-4 | Sol. 4 | 25.3 | no residual film | ≥5 |
| Example 3-5 | Sol. 5 | 25.3 | no residual film | ≥5 |
| Example 3-6 | Sol. 6 | 25.3 | no residual film | ≥5 |
| Example 3-7 | Sol. 7 | 25.1 | no residual film | ≥5 |
| Example 3-8 | Sol. 8 | 24.9 | no residual film | ≥5 |
| Example 3-9 | Sol. 9 | 25.0 | no residual film | ≥5 |
| Example 3-10 | Sol. 10 | 24.7 | no residual film | ≥5 |
| Example 3-11 | Sol. 15 | 25.3 | no residual film | ≥5 |
| Example 3-12 | Sol. 16 | 25.2 | no residual film | ≥5 |

As shown in Table 4, the organic films formed from Sols. 1 to 10 and 15 to 16 could be removed with ammonia hydrogen peroxide water at a rate of 5 nm/min or more.

Evaluation of Residue after Asking of Organic Resist Underlayer Film: Examples 4-1 to 15, Comparative Example 4-1

Spin-on carbon film ODL-102, available from Shin-Etsu Chemical Co., Ltd., was formed with a thickness of 200 nm on a silicon wafer as an organic resist underlayer film. The composition for forming an organic film (Sols. 1 to 10, 15 to 16, and 20 to 22) was applied thereon and baked at 285° C. for 60 seconds to form an organic film. On the other hand, in Comparative example 4-1, an organic film was not formed.

Then, a composition for forming a silicon-containing resist middle layer film (SiARC-1) shown in Table 5 was applied thereon and baked at 220° C. for 60 seconds to form a silicon-containing resist middle layer film with a thickness of 35 nm. An ArF resist solution for positive development (PR-1) shown in Table 6 was applied thereon and baked at 110° C. for 60 seconds to form a photoresist film with a thickness of 100 nm. Further, a liquid immersion top coat composition (TC-1) shown in Table 7 was applied on the photoresist film and baked at 90° C. for 60 seconds to form a top coat with a thickness of 50 nm.

Subsequently, the wafer was exposed with an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), developed with a 2.38% tetramethylammonium hydroxide (TMAH) aqueous solution for 30 seconds to form a 160 nm 1:1 positive line and space pattern. With respect to the wafer thus obtained, the cross-sectional shape of the pattern was observed with an electron microscope (S-4800) manufactured by Hitachi, Ltd., and pattern collapse was observed with an electron microscope (CG4000) manufactured by Hitachi High-Technologies Corporation.

The wafer with the photoresist pattern was then dry etched under treatment conditions shown in Table 8 and Table 9, with an etching apparatus Telius, manufactured by Tokyo Electron Ltd., to process the silicon-containing resist middle layer film and the organic resist underlayer film. Moreover, the cross-sectional shape of the pattern of the obtained wafer was observed with an electron microscope (S-9380) manufactured by Hitachi, Ltd.

Then, the wafer was treated with 65° C. of ammonia hydrogen peroxide water in which 29% ammonia water, 35% hydrogen peroxide water, and water have been mixed with a ratio of 1:1:8 for 5 minutes to remove the silicon-containing resist middle layer film remaining after processing the organic resist underlayer film in a wet manner. After treatment, the wafer was washed with pure water and dried by heating at 100° C. for 60 seconds. Moreover, the surface of the organic resist underlayer film was examined by XPS analysis with K-ALPHA manufactured by Thermo Fisher Scientific K.K., and silicon on the organic resist underlayer film was quantified to check whether the silicon material was removed with ammonia hydrogen peroxide water.

The organic resist underlayer film pattern obtained by the above procedures was processed under conditions shown in Table 10 with an etching apparatus Telius, manufactured by Tokyo Electron Ltd., and a residual organic resist underlayer film was removed by ashing. The wafer after ashing was observed with an electron microscope (CG4000) manufactured by Hitachi High-Technologies Corporation to check the presence or absence of residues. The result is given in Table 11.

Components of the composition for forming a silicon-containing resist middle layer film (SiARC-1) are shown in Table 5.

TABLE 5

| No. | Polymer (part by mass) | Additive (part by mass) | Solvent (part by mass) |
|---|---|---|---|
| SiARC-1 | SiARC polymer 1 (4.0) SiARC polymer 2 (0.2) | TPSNO₃ (0.02) Maleic acid (0.04) D-sorbitol (0.5) | PGEE (310) Water (65) |

TPSNO₃: triphenylsulfonium nitrate

The molecular weight and structural formula of SiARC polymer 1 shown in Table 5 are shown below.
SiARC polymer 1: Molecular weight (Mw)=2,800

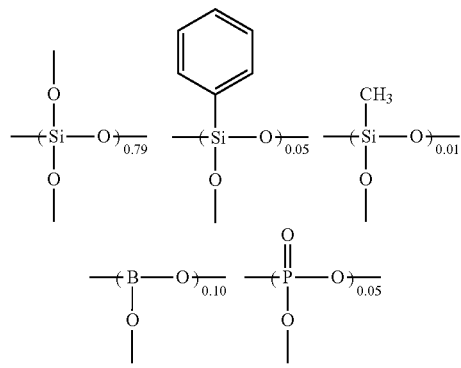

The molecular weight and structural formula of SiARC polymer 2 shown in Table 5 are shown below.
SiARC polymer 2: Molecular weight (Mw)=2,800

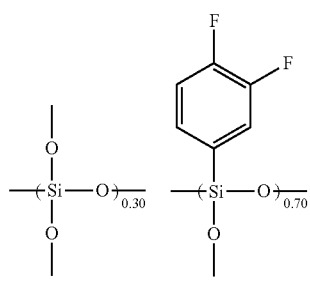

Components of the ArF resist solution for positive development (PR-1) are shown in Table 6.

TABLE 6

| No. | Polymer (part by mass) | Acid generator (part by mass) | Base (part by mass) | Solvent (part by mass) |
|---|---|---|---|---|
| PR-1 | ArF resist polymer 1 (100) | PAG 1 (7.0) | Quencher (1.0) | PGMEA (2,500) |

The molecular weight, dispersity, and structural formula of ArF resist polymer 1 shown in Table 6 are shown below.
ArF resist polymer 1:
  Molecular weight (Mw)=7,800
  Dispersity (Mw/Mn)=1.78

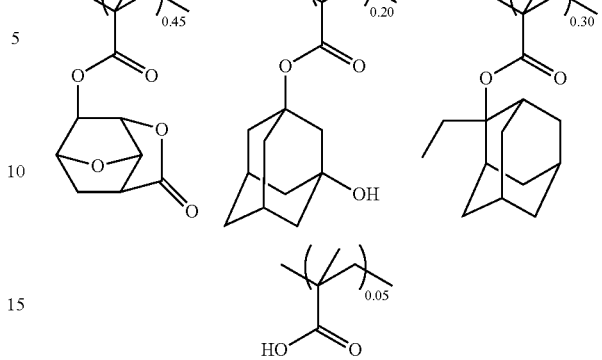

The structural formula of the acid generator PAG1 shown in Table 6 is shown below.

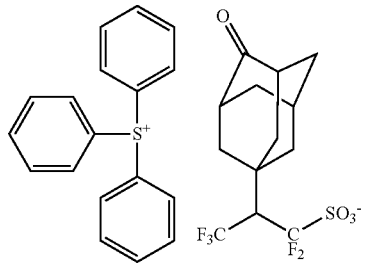

The structural formula of the base Quencher shown in Table 6 is shown below.

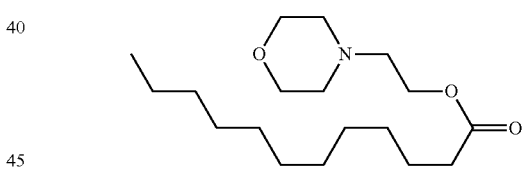

Components of the liquid immersion top coat composition (TC-1) used for patterning test by positive development are shown in Table 7.

TABLE 7

| Polymer (part by mass) | | Organic solvent (part by mass) |
|---|---|---|
| TC-1 | Top coat polymer (100) | Diisoamyl ether (2700) 2-Methyl-1-butanol (270) |

The molecular weight, dispersity, and structural formula of the top coat polymer shown in Table 7 are shown below.
Top coat polymer:
  Molecular weight (Mw)=8,800
  Dispersity (Mw/Mn)=1.69

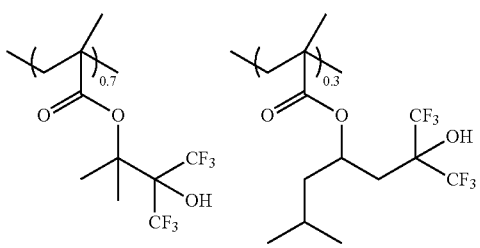

Dry etching processing conditions of the silicon-containing resist middle layer film are shown in Table 8.

TABLE 8

| Chamber pressure | 10 Pa |
|---|---|
| RF power | 200 W |
| $CF_4$ gas flow rate | 50 mL/min |
| $CHF_3$ gas flow rate | 50 mL/min |
| $N_2$ gas flow rate | 100 mL/min |
| Time | 20 seconds |

Dry etching processing conditions of the organic resist underlayer film are shown in Table 9.

TABLE 9

| Chamber pressure | 2.7 Pa |
|---|---|
| RF power | 1000 W |
| $N_2$ gas flow rate | 500 mL/min |
| $H_2$ gas flow rate | 30 mL/min |
| Time | 60 seconds |

Ashing removal conditions of the organic resist underlayer film are shown in Table 10.

TABLE 10

| Chamber pressure | 2.7 Pa |
|---|---|
| RF power | 1000 W |
| $N_2$ gas flow rate | 500 mL/min |
| $H_2$ gas flow rate | 30 mL/min |
| Time | 180 seconds |

Table 11 shows the observation results of cross-sectional shape and pattern collapse of the photoresist pattern obtained in the evaluation of residue after ashing of the organic resist underlayer film, the observation results of cross-sectional shape of the pattern after dry etching processing, the residual silicon amount on the surface of the organic resist underlayer film after treatment with ammonia hydrogen peroxide water, and the presence or absence of residues after ashing of the organic resist underlayer film pattern.

TABLE 11

| | Composition for forming organic film | Thickness of organic film after baking at 285° C. (nm) | Observation after photoresist development | | Pattern sectional shape after dry etching | Si amount on surface of organic resist underlayer film after treatment with ammonia hydrogen peroxide water (atomic %) | Residue after ashing of organic resist underlayer film pattern |
|---|---|---|---|---|---|---|---|
| | | | Pattern sectional shape | Pattern collapse | | | |
| Example 4-1 | Sol. 1 | 24.9 | rectangular | no collapse | rectangular | not detected | no residue |
| Example 4-2 | Sol. 2 | 25.4 | rectangular | no collapse | rectangular | not detected | no residue |
| Example 4-3 | Sol. 3 | 25.0 | rectangular | no collapse | rectangular | not detected | no residue |
| Example 4-4 | Sol. 4 | 25.3 | rectangular | no collapse | rectangular | not detected | no residue |
| Example 4-5 | Sol. 5 | 25.3 | rectangular | no collapse | rectangular | not detected | no residue |
| Example 4-6 | Sol. 6 | 25.3 | rectangular | no collapse | rectangular | not detected | no residue |
| Example 4-7 | Sol. 7 | 25.1 | rectangular | no collapse | rectangular | not detected | no residue |
| Example 4-8 | Sol. 8 | 24.9 | rectangular | no collapse | rectangular | not detected | no residue |
| Example 4-9 | Sol. 9 | 25.0 | rectangular | no collapse | rectangular | not detected | no residue |
| Example 4-10 | Sol. 10 | 24.7 | rectangular | no collapse | rectangular | not detected | no residue |
| Example 4-11 | Sol. 15 | 25.3 | rectangular | no collapse | rectangular | not detected | no residue |
| Example 4-12 | Sol. 16 | 25.2 | rectangular | no collapse | rectangular | not detected | no residue |
| Example 4-13 | Sol. 20 | 9.8 | rectangular | no collapse | rectangular | not detected | no residue |
| Example 4-14 | Sol. 21 | 100.3 | rectangular | no collapse | rectangular | not detected | no residue |
| Example 4-15 | Sol. 22 | 150.2 | rectangular | no collapse | side etching | not detected | no residue |
| Comparative example 4-1 | none | 0.0 | rectangular | no collapse | rectangular | 7.2 | residue was found |

As shown in Table 11, when the organic film formed from Sols. 1 to 10 and 15 to 16, which can be removed with ammonia hydrogen peroxide water, was used, no silicon remained on the organic resist underlayer film after treatment with ammonia hydrogen peroxide water, and no residue was caused after asking of the organic resist underlayer film pattern. Referring to the effect on the thickness of the organic film in Examples 4-13 to 15 and Comparative example 4-1, as shown in Example 4-13, when the organic film was thin, no silicon residue was found on the surface of the organic resist underlayer film after treatment with ammonia hydrogen peroxide water, and no residue was caused after ashing of the organic resist underlayer film pattern. Moreover, as shown in Example 4-15, when the film was thick, although side etching was observed on a part of the organic film at dry etching, no residue was caused after ashing of the organic resist underlayer film pattern. By contrast, as shown in Comparative example 4-1, when the organic film was not used, the silicon residue could not be removed, and residue was caused after ashing of the organic resist underlayer film pattern.

The above results demonstrated the following. The inventive composition for forming an organic film is capable of forming an organic film that can be easily removed, together with a silicon residue modified by dry etching, in a wet manner with a removing liquid harmless to a semiconductor apparatus substrate and an organic resist underlayer film required in the patterning process, and this composition is suitable as a material for an ion implantation blocking mask used for forming three-dimensional transistors. In particular, the use of the organic film having a thickness of 10 nm or more and less than 100 nm reliably enables a processing process without residues. This can prevent a reduction of the yield in the three-dimensional transistor manufacturing process and enables economical manufacture of a semiconductor apparatus with high performance.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A composition for forming an organic film, comprising:

a polymer compound having one or more repeating units shown by the following general formulae (2-1), (2-2), (3-1), and (3-2), wherein a proportion of the one or more repeating units shown by the general formulae (2-1), (2-2), (3-1) and (3-2) to all repeating units is 10% or more, with a whole of repeating units being 100%;

an organic solvent containing one or more compounds selected from propylene glycol esters, ketones, and lactones, the compounds having a total concentration of more than 30 wt % with respect to a whole organic solvent; and a thermal acid generator, or a crosslinking agent, or both, wherein the general formulae (2-1), (2-2), (3-1), and (3-2) are:

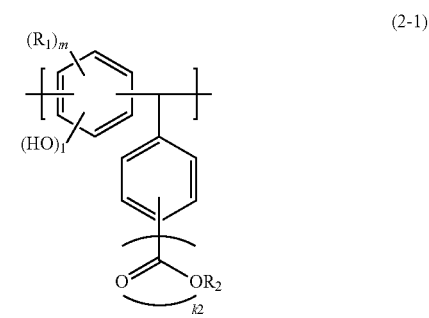

(2-1)

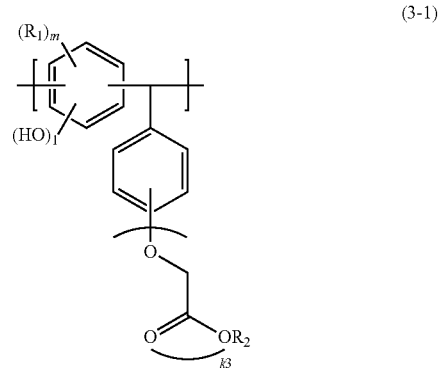

(3-1)

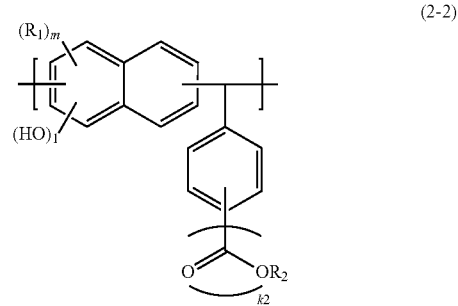

(2-2)

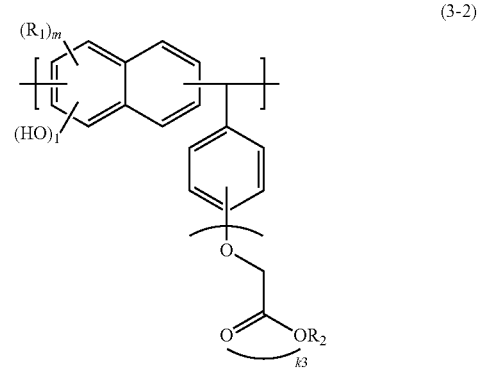

(3-2)

wherein $R_1$ represents a hydrocarbon group having 1 to 19 carbon atoms, a halogen atom, an alkoxy group, a carboxyl group, a sulfo group, a methoxycarbonyl group, a hydroxyphenyl group, or an amino group;

$R_2$ represents a hydrogen atom or AL which is a group capable of generating an acidic functional group by heat or acid, and in the general formula (2-1), $R_2$ represents a hydrogen atom or a t-butyl group;

$k_2$ and $k_3$ represent 1 or 2;

"l" represents 1 to 3;

"m" represents 0 to 3.

2. The composition for forming an organic film according to claim 1, wherein when the composition is applied onto a substrate by spin coating and then heated, the composition can provide an organic film that exhibits a dissolution rate of 5 nm/min or more by treatment with a solution containing 29% ammonia water, 35% hydrogen peroxide water, and water with a ratio of 1:1:8 at 65° C.

3. The composition for forming an organic film according to claim 1, wherein the composition can provide an organic film having a thickness of 10 nm or more and less than 100 nm.

4. The composition for forming an organic film according to claim 2, wherein the composition can provide an organic film having a thickness of 10 nm or more and less than 100 nm.

5. The composition for forming an organic film according to claim 1, wherein $R_1$ represents a hydrocarbon group having 1 to 19 carbon atoms, an alkoxy group, a carboxyl group, a methoxycarbonyl group, and a hydroxyphenyl group.

6. The composition for forming an organic film according to claim 5, wherein the propylene glycol esters include propylene glycol methyl ether acetate.

7. The composition for forming an organic film according to claim 6, wherein the polymer compound has one or more of the repeating units shown by the general formulae (2-2), (3-1), and (3-2).

* * * * *